(12) United States Patent
Wang et al.

(10) Patent No.: US 12,386,251 B2
(45) Date of Patent: Aug. 12, 2025

(54) METHOD AND SYSTEM TO INTRODUCE BRIGHT FIELD IMAGING AT STITCHING AREA OF HIGH-NA EUV EXPOSURE

(71) Applicant: Taiwan Semiconductor Manufacturing Co., Ltd., Hsinchu (TW)

(72) Inventors: Sheng-Min Wang, Hsinchu (TW); Ken-Hsien Hsieh, Hsinchu (TW); Manuel Alejandro Fernandez Lopez, Hsinchu (TW); Yu-Tse Lai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 149 days.

(21) Appl. No.: 18/313,203

(22) Filed: May 5, 2023

(65) Prior Publication Data
US 2024/0248387 A1    Jul. 25, 2024

Related U.S. Application Data

(60) Provisional application No. 63/480,926, filed on Jan. 20, 2023.

(51) Int. Cl.
| | |
|---|---|
| G03F 1/24 | (2012.01) |
| G03F 1/22 | (2012.01) |
| G03F 1/52 | (2012.01) |
| G03F 1/70 | (2012.01) |
| G03F 1/80 | (2012.01) |
| G03F 7/00 | (2006.01) |

(Continued)

(52) U.S. Cl.
CPC ............... *G03F 1/22* (2013.01); *G03F 1/24* (2013.01); *G03F 1/52* (2013.01); *G03F 1/80* (2013.01); *G03F 7/2004* (2013.01); *G03F 7/70033* (2013.01); *G03F 7/702* (2013.01); *G03F 7/70475* (2013.01); *H01L 21/0274* (2013.01)

(58) Field of Classification Search
CPC ..... G03F 1/22; G03F 1/24; G03F 1/52; G03F 1/80; G03F 7/2004; G03F 7/70033; G03F 7/702; G03F 7/70475; H01L 21/0274
See application file for complete search history.

(56) References Cited

U.S. PATENT DOCUMENTS

| | | | |
|---|---|---|---|
| 6,379,868 B1 * | 4/2002 | White ............... | G03F 7/70308 430/311 |
| 11,243,461 B2 * | 2/2022 | Wu .................... | G03F 1/38 |

(Continued)

FOREIGN PATENT DOCUMENTS

| | | |
|---|---|---|
| CN | 103454866 A | 12/2013 |
| CN | 103472689 A | 12/2013 |

(Continued)

*Primary Examiner* — Mark R Gaworecki
(74) *Attorney, Agent, or Firm* — Seed IP Law Group

(57) ABSTRACT

A first bright field reticle and a second bright field reticle are utilized for a double exposure EUV photolithography process in which exposure areas of the first and second bright field reticles overlap. The first and second reticles each include, respectively, a substrate, a reflective multilayer on the substrate, a main pattern of absorption material on the reflective multilayer, a black border area, and an additional absorption area of the absorption material between the black border and the main pattern.

20 Claims, 31 Drawing Sheets

(51) Int. Cl.
  *G03F 7/20* (2006.01)
  *G03F 7/26* (2006.01)
  *H01L 21/027* (2006.01)

(56) References Cited

U.S. PATENT DOCUMENTS

| 2010/0055626 | A1 | 3/2010 | Endou et al. | |
|---|---|---|---|---|
| 2020/0004133 | A1 | 1/2020 | Hsu et al. | |
| 2022/0057706 | A1* | 2/2022 | Lee | G03F 1/40 |
| 2022/0163881 | A1* | 5/2022 | Yeh | G03F 1/32 |
| 2023/0121303 | A1* | 4/2023 | Lee | G03F 1/24 |
| | | | | 430/5 |

FOREIGN PATENT DOCUMENTS

| JP | 2007043199 A | 2/2007 |
|---|---|---|
| TW | 201907446 A | 2/2019 |

* cited by examiner

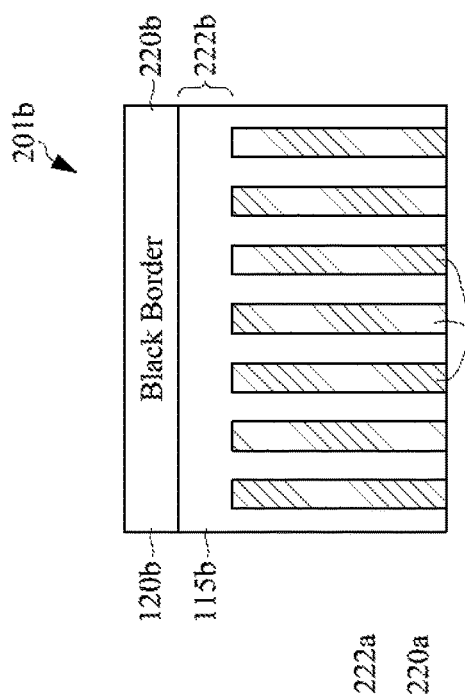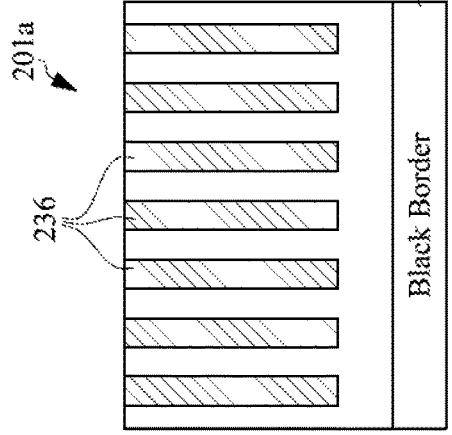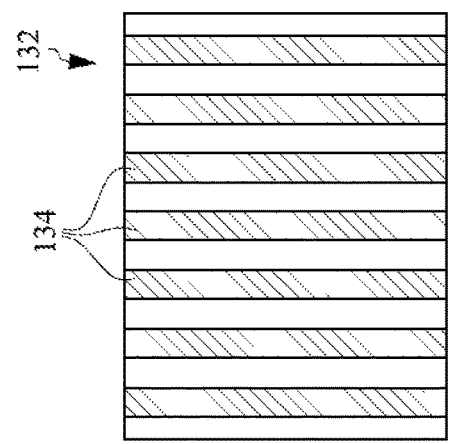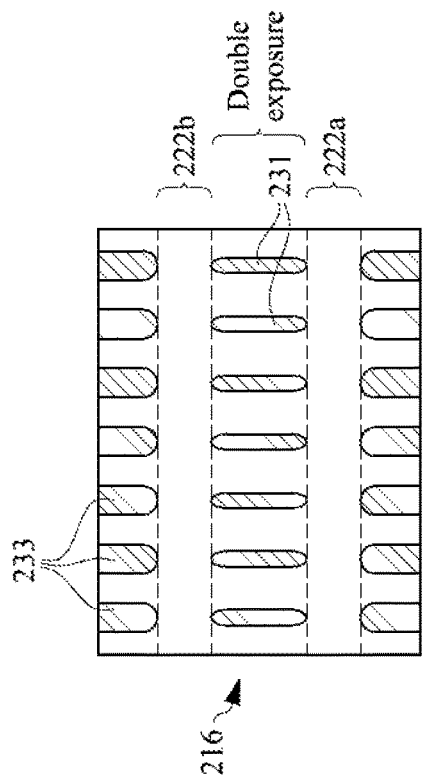

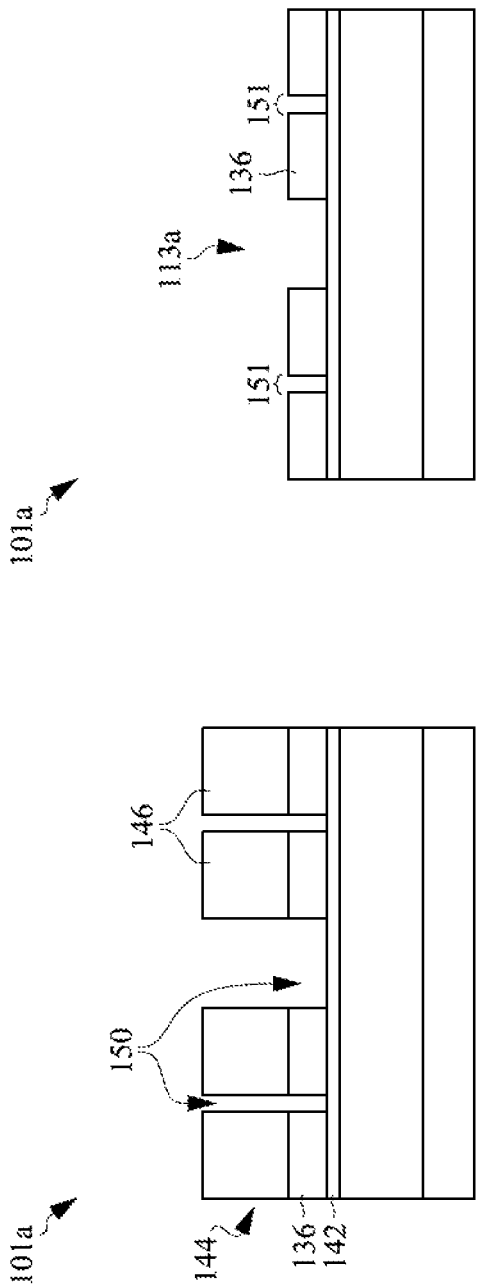

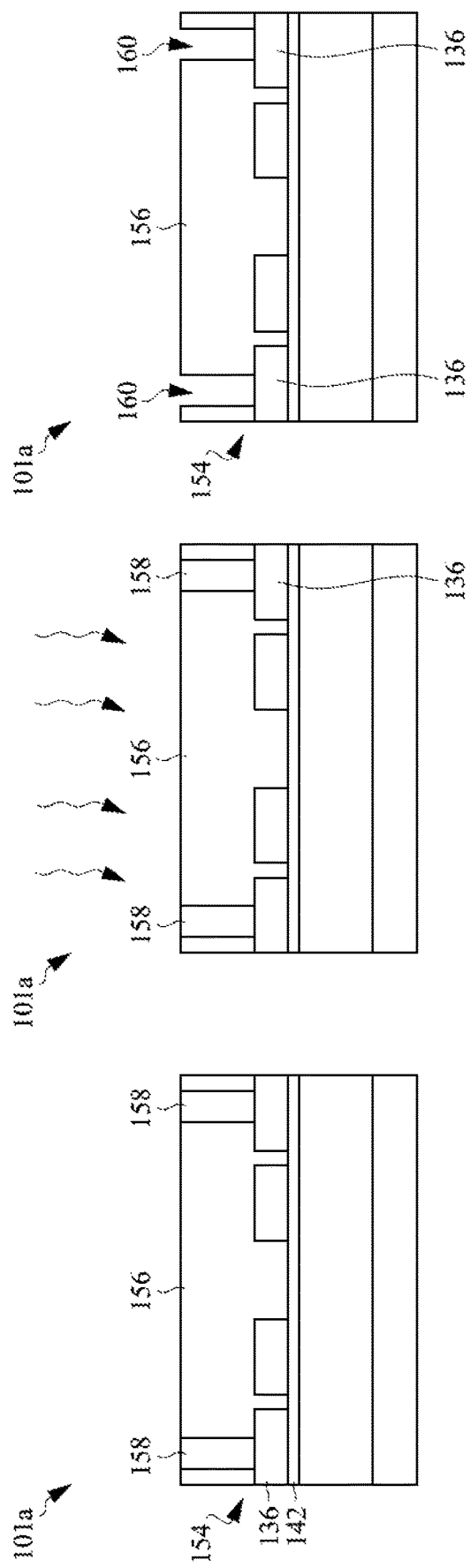

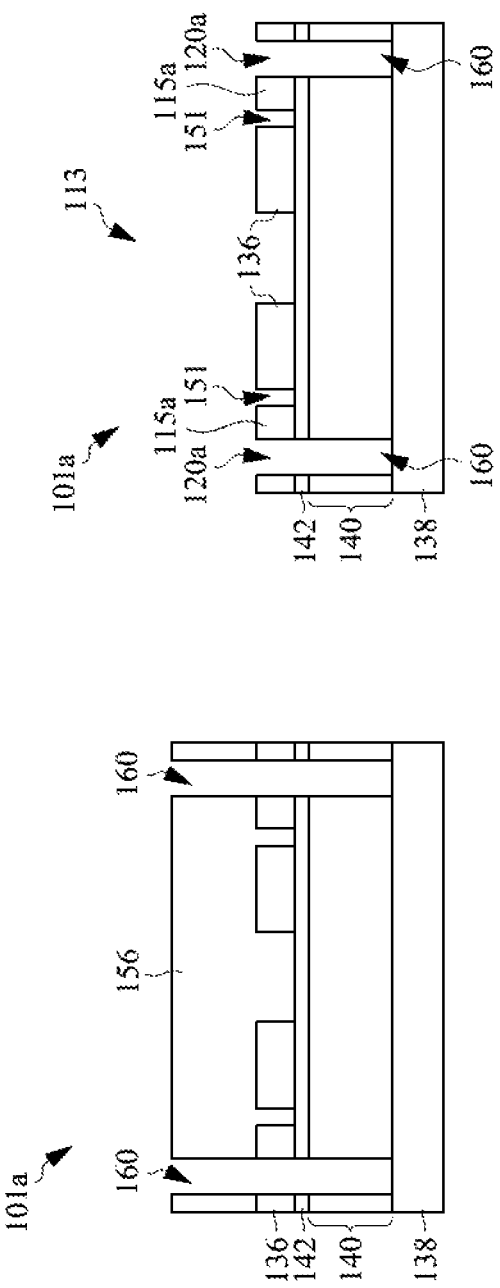

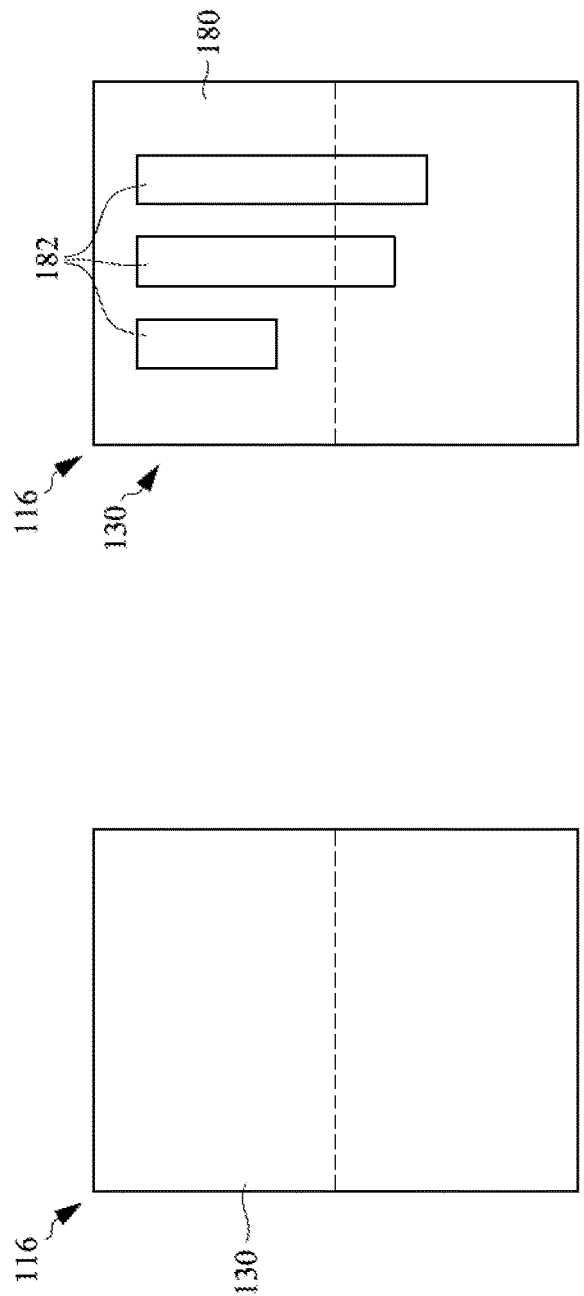
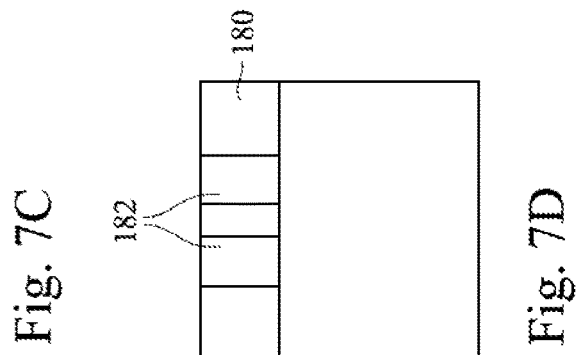
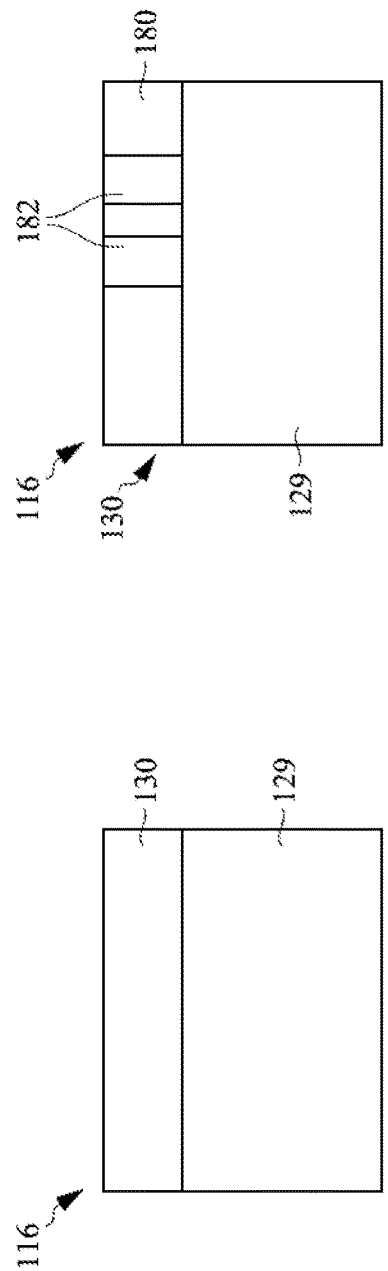

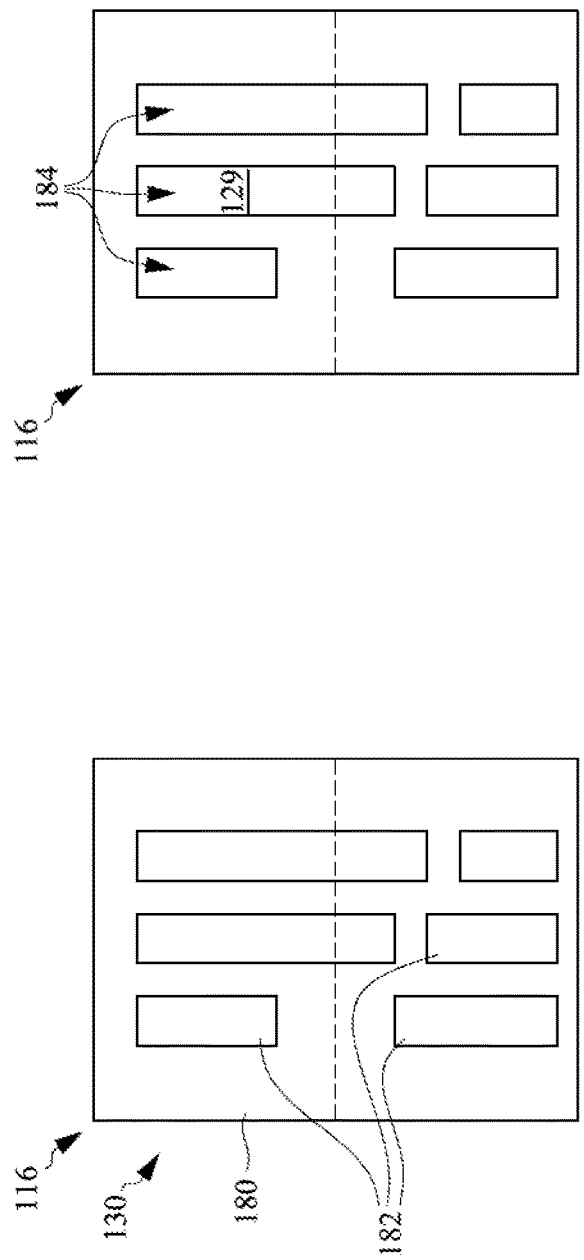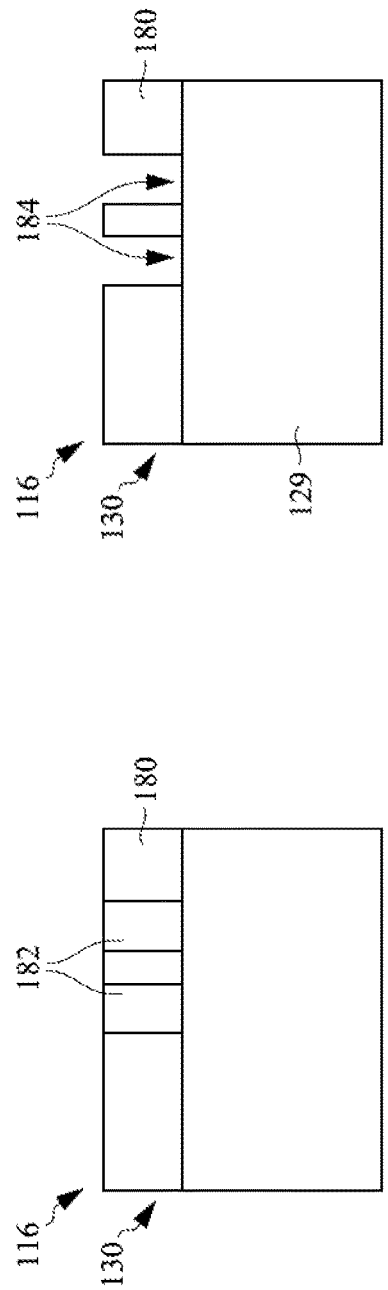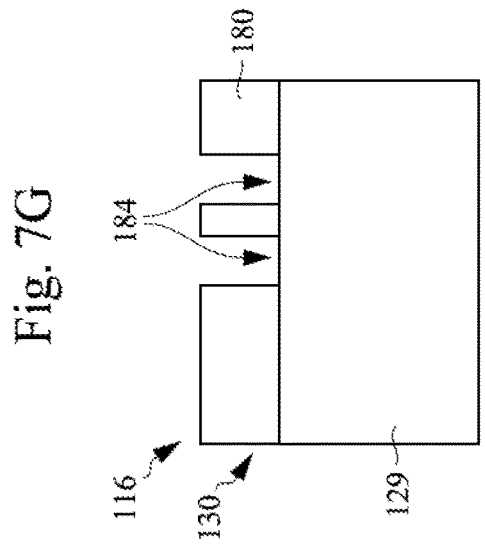

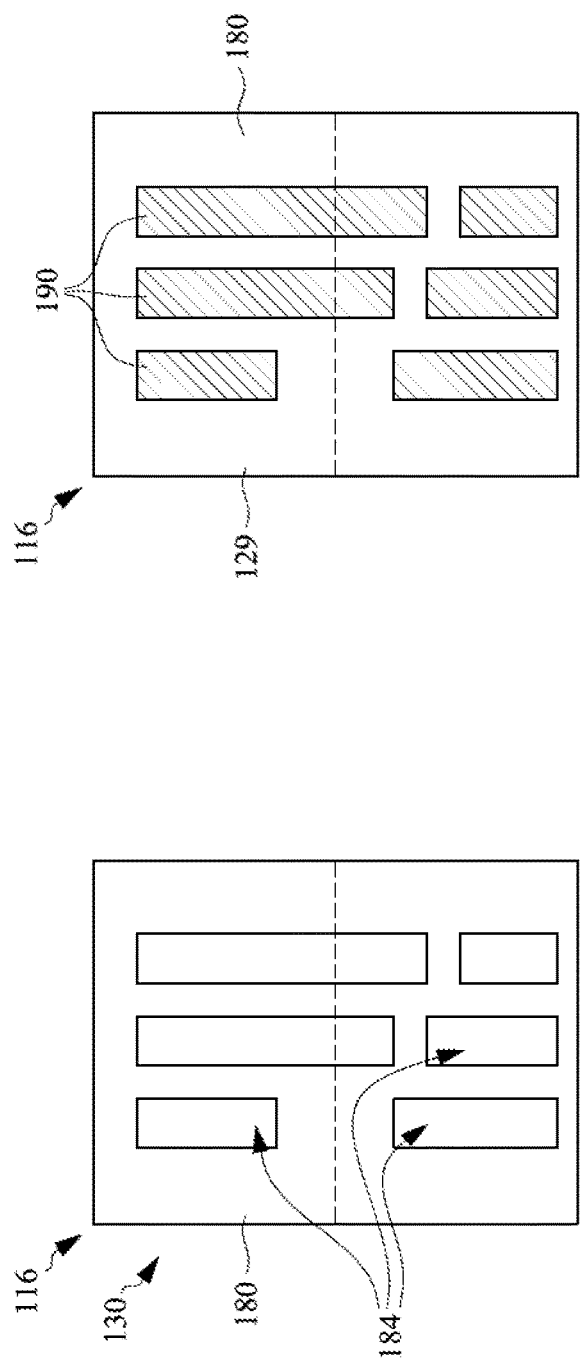
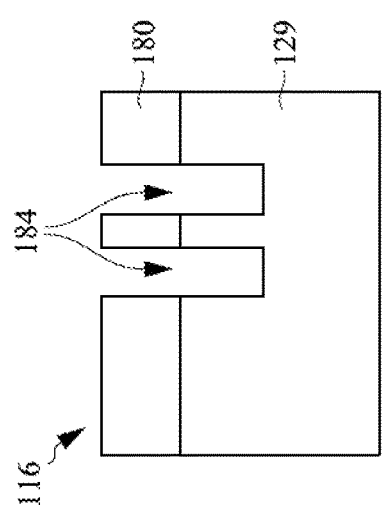
Fig. 7K
Fig. 7L
Fig. 7I
Fig. 7J

METHOD AND SYSTEM TO INTRODUCE BRIGHT FIELD IMAGING AT STITCHING AREA OF HIGH-NA EUV EXPOSURE

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features in an integrated circuit are produced, in part, with the aid of photolithography. Traditional photolithography techniques include generating a mask outlining the pattern of features to be formed on an integrated circuit die. The photolithography light source irradiates the integrated circuit die via the mask. The size of the features that can be produced via photolithography of the integrated circuit die is limited, in part, on the lower end, by the wavelength of light produced by the photolithography light source. Smaller wavelengths of light can produce smaller feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2H are top views of a wafer layout, photolithography reticles, and a patterned wafer, in accordance with some embodiments.

FIGS. 3A-3K are cross-sectional views of an EUV reticle at various stages of processing, in accordance with some embodiments.

FIGS. 7A-7L are top views and cross-sectional views of a wafer at various stages of processing with a double exposure EUV photolithography process, in accordance with some embodiments.

DETAILED DESCRIPTION

Figure 1A:
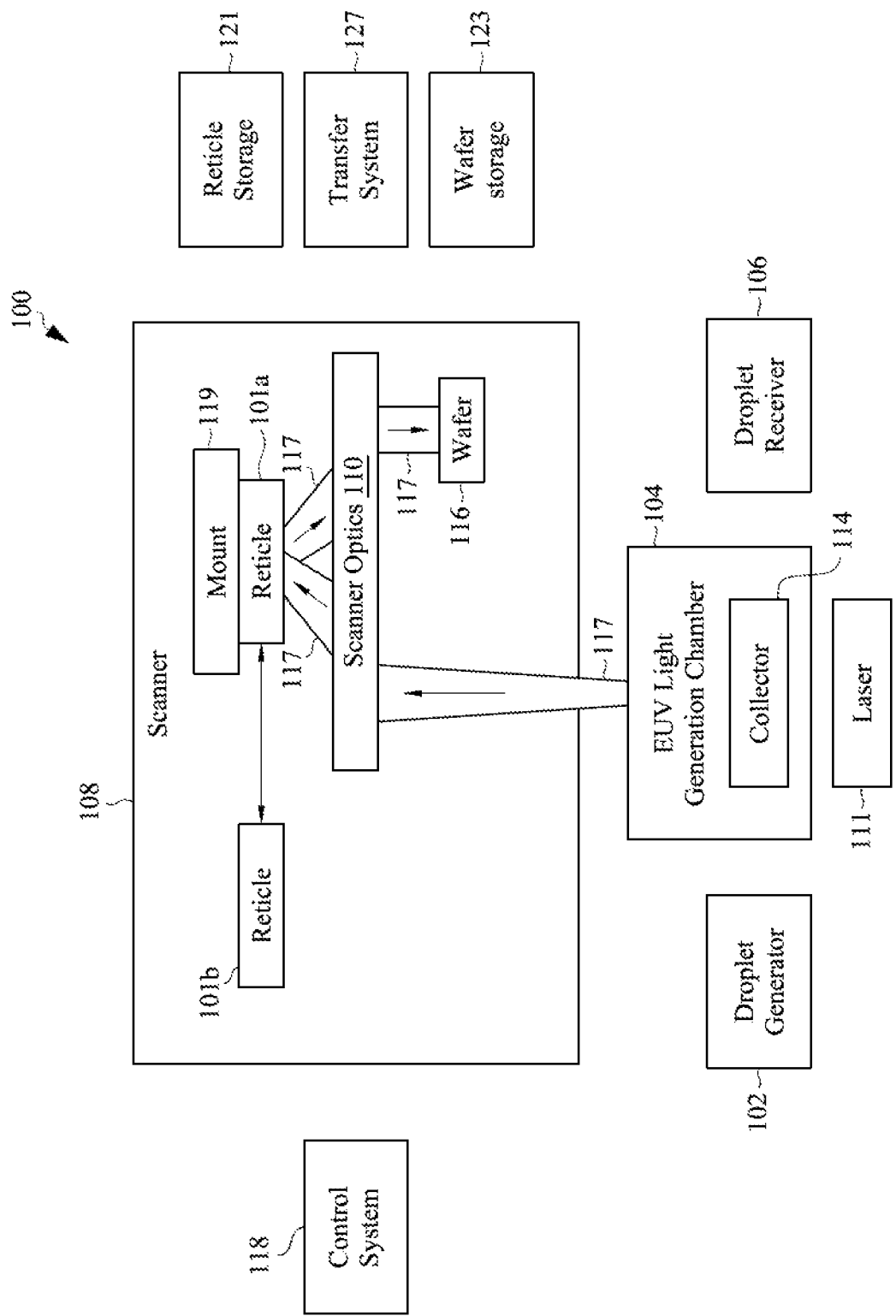
FIG. 1A is a block diagram of an EUV photolithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms.

Extreme ultraviolet (EUV) light is used to produce particularly small features due to the relatively short wavelength of EUV light. In particular, high numerical aperture (NA) EUV exposure is adopted for finer resolution. The exposure field of high-NA EUV may be half of that of low-NA EUV. This may result in the use of double exposures. To ensure acceptable wafer yields for dense pitch metal lines, a metallic photoresist, which typically is negative tone, may be used. Because metal layers may utilize photoresist trenches on a wafer, bright field reticles may be used. However, there are difficulties associated with the use of bright field reticles in high-NA EUV.

As used herein, the term "high-NA" may correspond to NA values greater than 0.33. As used herein, the term "low-NA" may correspond to NA values less than 0.33. As used herein, the term "bright field reticle" may correspond to a photolithography reticle in which the absorption material of the main pattern defines the trenches or holes that will be formed in a layer of negative photoresist. As used herein, the term "dark field reticle" may correspond to a photolithography reticle in which the exposed portions of a reflective multilayer surrounded by absorption material define the trenches or holes that will be formed in layer of positive photoresist.

Embodiments of the disclosure enable the effective use of bright field reticles in high-NA photolithography processes. Embodiments of the present disclosure enable the use of two bright field reticles to produce a single pattern on a wafer via double exposure and stitching. Each bright field reticle includes a reflective multilayer surrounded by a black border. The pattern of the reticle is provided by a patterned absorption layer on the reflective multilayer. Each reticle also includes an additional absorption area on the reflective multilayer at the edge of the black border. The additional absorption area enables the half field exposure and stitching of two bright field reticles to produce, in a layer of photoresist on a wafer, patterns for metal lines that do not include undesired breakages. The result is that bright field reticles can be used to reliably produce metal line patterns with very small pitches. This results in integrated circuits have improved feature density. Wafer yields are also improved.

FIG. 1A is a block diagram of an EUV photolithography system 100, according to some embodiments. The components of the EUV photolithography system 100 cooperate to perform photolithography processes. As will be set forth in more detail below, the photolithography system 100 utilizes multiple high-NA bright field reticles to produce a single pattern on a wafer. As used herein, the terms "EUV light" and "EUV radiation" can be used interchangeably.

The EUV photolithography system 100 includes a droplet generator 102, an EUV light generation chamber 104, a droplet receiver 106, a scanner 108, and a laser 111. The droplet generator 102 outputs droplets into the EUV light generation chamber 104. The laser 111 irradiates the droplets with pulses of laser light within the EUV light generation chamber 104. The irradiated droplets emit EUV light 117. The EUV light 117 is collected by a collector 114 and reflected toward the scanner 108. The scanner 108 conditions the EUV light 117, reflects the EUV light 117 off of reticles 101a/101b including a mask pattern, and focuses the EUV light 117 onto the wafer 116. The EUV light 117 patterns a layer on the wafer 116 in accordance with a pattern of the reticles 101a/101b. Each of these processes is described in more detail below.

The droplet generator 102 generates and outputs a stream of droplets. The droplets can include tin, though droplets of other material can be utilized without departing from the scope of the present disclosure. The droplets move at a high rate of speed toward the droplet receiver 106. The droplets have an average velocity between 60 m/s to 200 m/s. The droplets have a diameter between 10 µm and 200 µm. The generator 102 may output between 1000 and 100000 droplets per second. The droplet generator 102 can generate droplets having different initial velocities and diameters than those described above without departing from the scope of the present disclosure.

In some embodiments, the EUV light generation chamber 104 is a laser produced plasma (LPP) EUV light generation system. As the droplets travel through the EUV light generation chamber 104 between the droplet generator 102 and the droplet receiver 106, the droplets are irradiated by the laser 111. When a droplet is irradiated by the laser 111, the energy from the laser 111 causes the droplet to form a plasma. The plasmatized droplets generate EUV light 117. This EUV light 117 is collected by the collector 114 and passed to the scanner 108 and then on to the wafer 116.

In some embodiments, the laser 111 is positioned external to the EUV light generation chamber 104. During operation, the laser 111 outputs pulses of laser light into the EUV light generation chamber 104. The pulses of laser light are focused on a point through which the droplets pass on their way from the droplet generator 102 to the droplet receiver 106. Each pulse of laser light is received by a droplet. When the droplet receives the pulse of laser light, the energy from the laser pulse generates a high-energy plasma from the droplet. The high-energy plasma outputs EUV light 117.

In some embodiments, the laser 111 irradiates the droplet with two pulses. A first pulse causes the droplet to flatten into a disk like shape. The second pulse causes the droplet to form a high temperature plasma. The second pulse is significantly more powerful than the first pulse. The laser 111 and the droplet generator 102 are calibrated so that the laser emits pairs of pulses such that the droplet is irradiated with a pair of pulses. The laser 111 can irradiate droplets in a manner other than described above without departing from the scope of the present disclosure. For example, the laser 111 may irradiate each droplet with a single pulse or with more pulses than two. In some embodiments, there are two separate lasers. A first laser delivers the flattening pulse. A second laser delivers the plasmatizing pulse.

In some embodiments, the light output by the droplets scatters randomly in many directions. The photolithography system 100 utilizes the collector 114 to collect the scattered EUV light 117 from the plasma and direct or output the EUV light 117 toward the scanner 108.

The scanner 108 includes scanner optics 110. The scanner optics 110 include a series of optical conditioning devices to direct the EUV light 117 to the reticle. The scanner optics 110 may include refractive optics such as a lens or a lens system having multiple lenses (zone plates). The scanner optics 110 may include reflective optics, such as a single mirror or a mirror system having multiple mirrors. The scanner optics 110 direct the ultraviolet light from the EUV light generation chamber 104 to a reticle 101a/101b.

FIG. 1A illustrates a first reticle 101a coupled to a mount 119. The mount 119 holds the reticle 101a during a first exposure process of a double exposure photolithography process. After the first exposure process, the reticle 101a is unloaded or dismounted from the mount 119 and a second reticle 101b is mounted or loaded onto the mount 119. A second exposure process of the double exposure photolithography process is then performed with the second reticle 101b. Further details regarding a double exposure photolithography process are described below.

During an EUV exposure process, EUV light 117 reflects off of the reticle 101a/101b (whichever is mounted) back toward further optical features of the scanner optics 110. In some embodiments, the scanner optics 110 include a projection optics box. The projection optics box may have refractive optics, reflective optics, or combination of refractive and reflective optics. The projection optics box directs the EUV light 117 onto the wafer 116, for example, a semiconductor wafer.

The EUV light 117 includes a pattern from the reticle 101a/101b. In particular, the reticle 101a/101b includes the pattern to be defined in the wafer 116. After the EUV light 117 reflects off of the reticle 101a/101b, the EUV light 117 contains the pattern of the reticle 101a/101b. A layer of photoresist typically covers the wafer 116 during extreme ultraviolet photolithography irradiation. The photoresist assists in patterning a surface of the semiconductor wafer 116 in accordance with the pattern of the reticle.

In some embodiments, the photolithography system 100 utilizes a double exposure process to form a single pattern on a wafer 116. In the double exposure process, the photolithography system 100 uses a first reticle 101a and a second reticle 101b. The first reticle 101a includes a first portion of a pattern to be formed on the wafer 116. The second reticle 101b includes a second portion of the pattern to be formed on the wafer 116. During the first exposure of the double exposure process, the first reticle 101a is loaded into the scanner 108 and EUV light 117 is generated and reflected off the reticle 101a onto the wafer 116, imparting the first portion of the pattern onto the wafer 116. The first reticle 101a is then unloaded from the mount 119 to a location internal or external to the scanner 108. The second reticle 101b is then loaded onto the mount 119 and the second exposure of the double exposure process is performed, imparting the second portion of the pattern onto the wafer 116.

In some embodiments, a high-NA EUV exposure is adopted to obtain finer resolution in forming patterns for metal lines (or other features) on a wafer 116. However, the exposure area of high-NA EUV light is half of that of low NA EUV light. The result is that for high-NA EUV processes, double exposures are utilized. To ensure acceptable yields for dense-pitch patterns of metal lines, a metallic photoresist may be utilized. Metallic photoresist is typically a negative tone photoresist. As patterning metal layers on a wafer may utilize photoresist trenches on the wafer 116, it is beneficial to utilize bright field reticles with negative photoresist.

However, when using bright field reticles for double exposure photolithography processes, there may be some difficulties. In particular, the patterns on the reticles 101a and 101b overlap with each other to some extent. The overlapping portions of the patterns of the reticles 101a and 101b correspond to a stitching area, or a double exposure area. It is possible that in the stitching area, in the portion of the photoresist layer on the wafer 116 that has been exposed twice to the EUV light the pattern may be distorted, destroyed, or otherwise damaged. This can result in poorly functioning integrated circuits and low wafer yields.

Figure 1B:
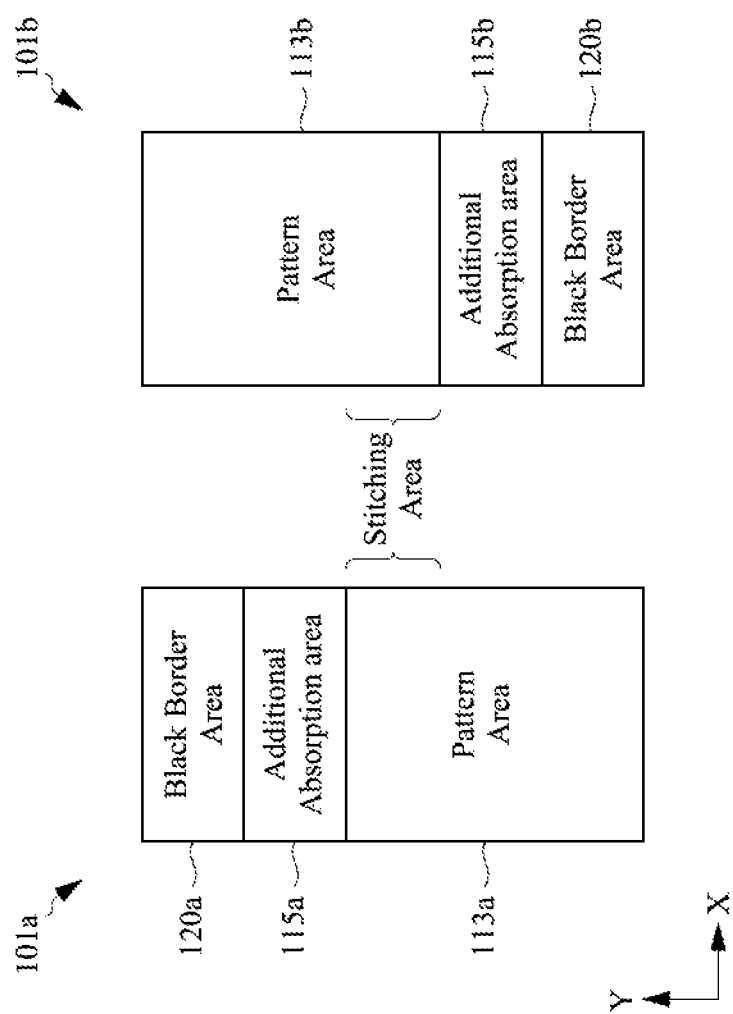
FIG. 1B is a block diagram of two EUV reticles, in accordance with some embodiments.

FIG. 1B is a simplified diagram of the high-NA bright field EUV reticles 101a and 101b of FIG. 1A. Each of the reticles 101a and 101b includes a pattern area 113a/b, an additional absorption area 115a/b, and a black border area 120a/b. Though not shown in FIG. 1A, each reticle 101a and 101b includes a substrate, a reflective multilayer on the substrate, and an absorption material on the reflective multilayer. The absorption material absorbs EUV light. The reflective multilayer reflects the EUV light. In a bright field EUV reticle, the absorption material is patterned so that remaining portions of the absorption material correspond to the pattern of the reticle. Where no absorption material remains, the reflective multilayer is exposed to reflect EUV light. When EUV light is incident on a reticle 101a or 101b, the EUV light reflects off of the reflective multilayer and carries the pattern of the remaining portions of the absorption material.

With a bright field EUV reticle 101a/b the unexposed portions of the photoresist on the wafer 116 will carry the pattern of the absorption material. With a negative photoresist, such as a metallic photoresist, the exposed portions of the photoresist will become hardened. After development, the unexposed portions of the photoresist will be removed, leaving a pattern of trenches in the photoresist. The pattern of trenches corresponds to the pattern of absorption material on the EUV reticle 101a/b. Metal lines can be formed on the wafer 116 in the position of the pattern of the trenches in the photoresist.

Each of the reticles 101a and 101b includes a black border area 120a/b. The black border area 120a/b corresponds to a peripheral area of the reticles 101a and 101b in which the reflective multilayer and the absorption material have been removed to expose the substrate below the reflective multilayer. In some cases, when forming the black border area 120a/b by etching through the reflective multilayer, an undercut may be formed in the reflective multilayer. In other words, the trenches etched in the reflective multilayer may be wider closer to the substrate. These areas that are undercut cannot be used for the pattern area 113a/b. These may be referred to as pattern forbidden areas.

In accordance with principles of the present disclosure, additional absorption areas 115a/b are placed adjacent to the black border area 120a/b at the locations corresponding to the pattern forbidden areas. The additional absorption areas 115a/b correspond to areas in which absorption material has been placed abutting the black border area 120a/b. As will be set forth in more detail below, the presence of the additional absorption area 115a/b results in the ability to form photoresist patterns in a wafer using double exposure high-NA process with bright field reticles without defects in the photoresist patterns. This in turn results in the ability to form high density (i.e., low pitch) arrays of metal lines in the wafer 116. If the additional absorption areas 115a/b are not present adjacent to the black border area 120a/b, then undesired breaks in the photoresist may result, resulting in an inability to properly formed high density (i.e., low pitch) metal lines in the wafer 116.

Returning to FIG. 1A, the EUV photolithography system 100 includes a control system 118. The control system 118 is communicatively coupled to the droplet generator 102 and the laser 111. The control system 118 can control the operation of the droplet generator 102 and the laser 111. The control system 118 can adjust operating parameters of the droplet generator 102 and the laser 111. Accordingly, the control system 118 controls the performance of EUV exposure processes.

In some embodiments, the control system 118 is also communicatively coupled to a mount (not shown) that holds the wafer 116. The wafer mount can be translated via one or more motors or other types of motivator units under control of the control system 118. A plurality of integrated circuits may be formed on the wafer 116. During a double exposure process, the first reticle 101a is loaded onto the mount 119, the control system 118 then controls the photolithography system 100 to expose each integrated circuit area in turn to EUV light via the first reticle 101a. After each exposure, the control system 118 causes the wafer mount to move so that a next integrated circuit area of the wafer is positioned to receive the EUV exposure via the first reticle 101a. After each integrated circuit area of the wafer 116 has received an EUV exposure via the first reticle 101a, the control system 118 unloads the first reticle 101a from the mount 119 and loads the second reticle 101b onto the mount 119. The control system 118 then causes each integrated circuit area of the wafer to receive the second EUV exposure via the second reticle 101b.

The EUV system 100 includes a reticle storage 121. The reticle storage 121 may include storage and protection pods that enclose and protect the reticles 101a/101b when the reticles 101a/101b are not in use. After the reticles 101a/101b have been initially manufactured, the reticles 101a/101b may immediately be enclosed in the reticle storage 121. The reticle 101a/101b remains in the reticle storage 121 during transport from the manufacturing site to the wafer processing site. The reticle storage 121 may provide very strong protection against contaminants when the reticle 101a/101b is not in use.

The reticles 101a/101b may remain in the reticle storage 121 until the reticles 101a/101b are to be utilized in the EUV photolithography process. At this time, the reticles 101a/101b are transferred from the reticle storage 121 into the scanner 108. The reticle storage 121, or portions of the reticle storage 121 may be carried into the scanner 108. The reticles 101a/101b are then unloaded from the reticle storage 121 onto the mount 119, in turn, for the double exposure EUV process. After the EUV process, the reticles 101a/101b are unloaded from the mount 119 to the reticle storage 121.

The EUV photolithography system 100 may also include a wafer storage 123. The wafer storage 123 stores wafers 116 when the wafers are not in use. The wafer storage 123 may include storage for wafers 116 that have yet to be transferred into the scanner 108 for patterning. The wafer storage may include storage for wafers 116 that have already been patterned within the scanner 108.

The EUV system 100 includes a transfer system 127. The transfer system 127 may include one or more robot arms. The one or more robot arms can transfer the reticles 101a/101b between the scanner 108, the reticle storage 121, a reticle scanner, and a reticle cleaning station. The one or more robot arms can also transfer wafers 116 between the scanner 108 and the wafer storage 123. In some embodiments, robot arms that transfer wafers 116 are separate from robot arms that transfer the reticle 101a/101b. The EUV system 100 can include other types of reticle transport systems without departing from the scope of the present disclosure.

Figure 1C:
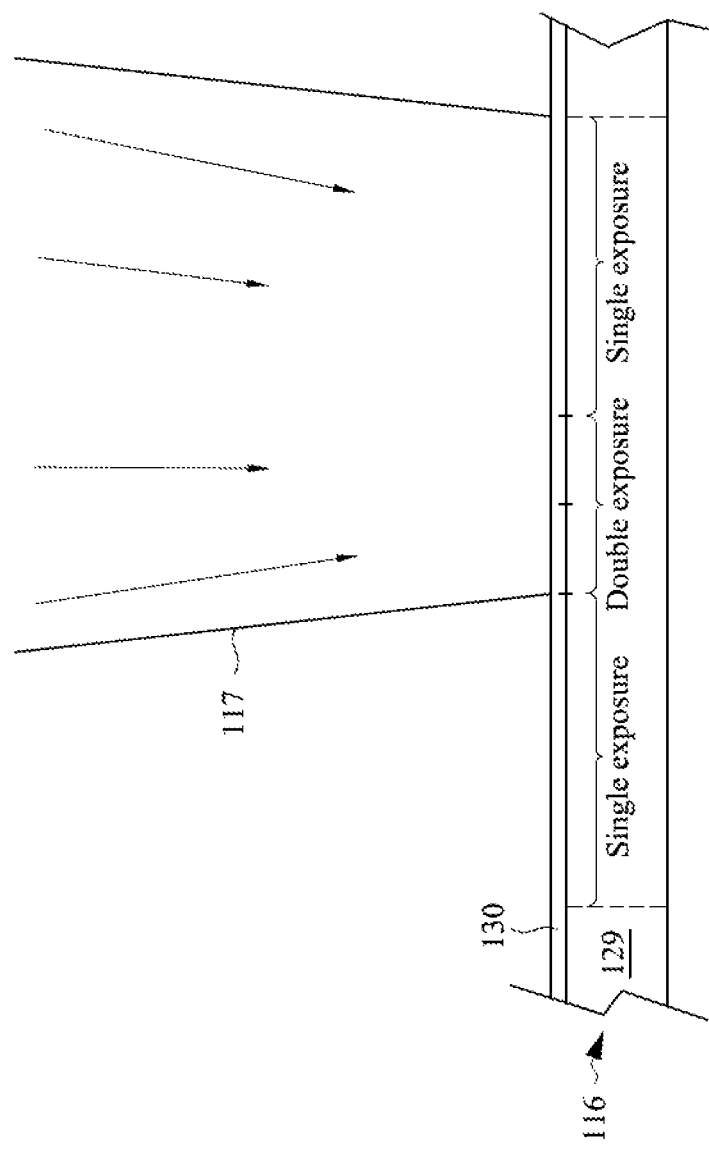
FIGS. 1C and 1D are cross-sectional views of a wafer during a double exposure photolithography process, in accordance with some embodiments.

FIG. 1C is a cross-sectional view of a portion of a wafer 116 during a first EUV exposure process of a double exposure process. In particular, FIG. 1C illustrates a portion of the wafer 116 corresponding to a single illustrated circuit delineated by dashed lines. The wafer 116 includes a layer of negative metallic photoresist 130 on a substrate 129. FIG. 1C illustrates that the integrated circuit includes a first single exposure area on the right, a double exposure area in the middle, and a second single exposure area on the left. During a first exposure process of the double exposure process, the first reticle 101a is loaded onto the mount 119. EUV light is generated and reflected off of the first reticle 101a onto the wafer 116. During exposure via the first reticle 101a, the right single exposure area and the central double exposure area are exposed to EUV light 117 carrying the pattern of the first reticle 101a.

Figure 1D:
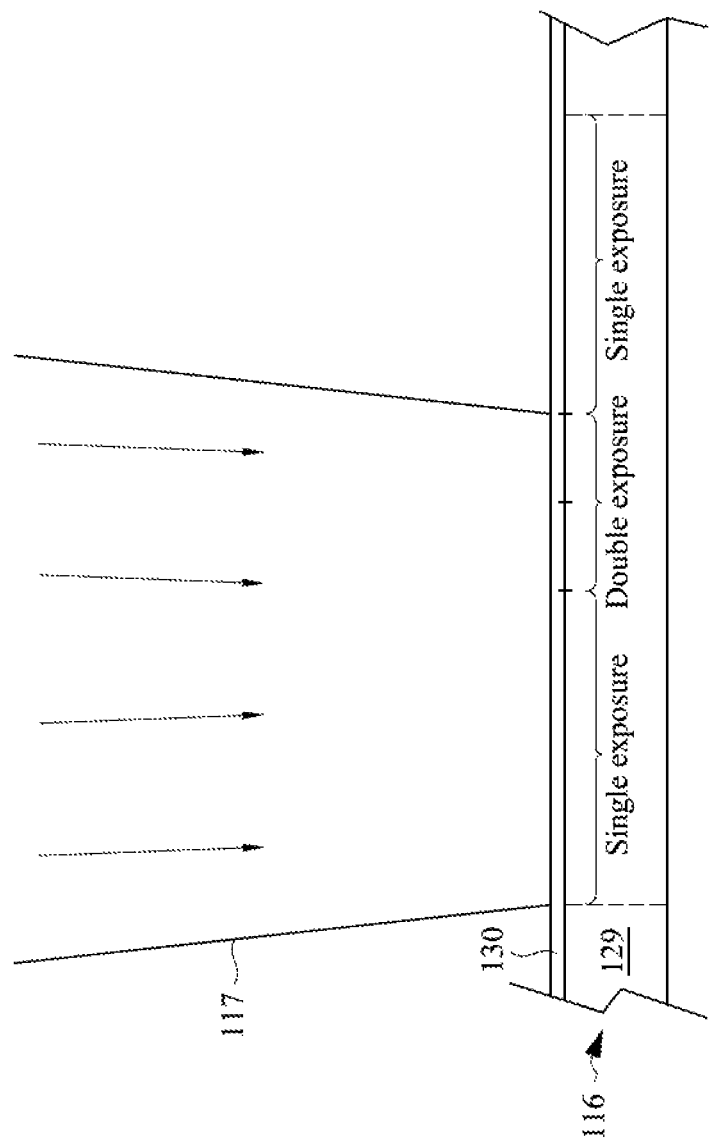

FIG. 1D corresponds to the same cross-sectional view of the wafer 116 as shown in FIG. 1C, but during a second exposure process of the double exposure process. In particular, during the second exposure process the second reticle 101b has been loaded into the mount 119 and EUV light 117 has been generated and reflected off of the reticle 101b onto the wafer 116. During the second exposure, the left single exposure area and the central double exposure area are exposed to EUV light carries the pattern of the second reticle 101b. Because the first reticle 101a and the second reticle 101b each include the additional absorption area 115a/b adjacent to the respective black border areas 120a/b, a dense pattern of trenches can be properly formed in the layer of photoresist 130 utilizing high-NA EUV double exposure via bright field reticles 101a and 101b.

Figure 2C:
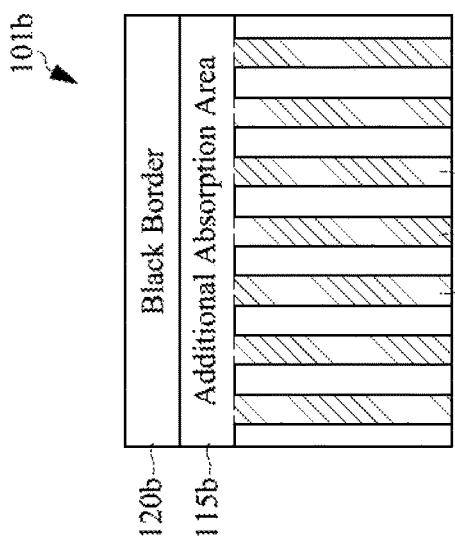
Figure 2B:
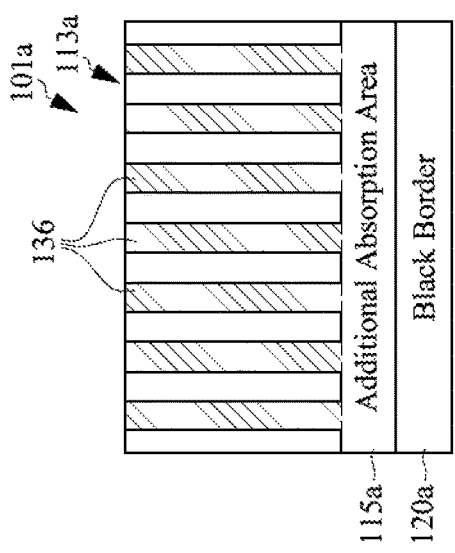
Figure 2A:
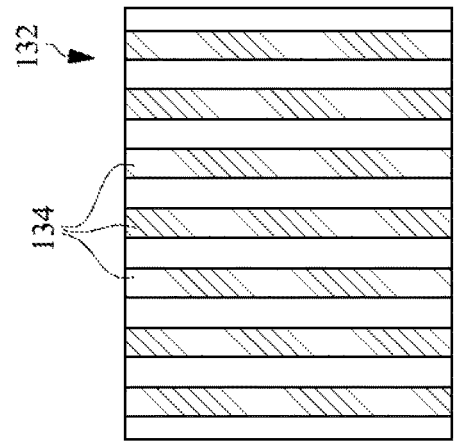

FIG. 2A is a top view of a layout 132, in accordance with some embodiments. The layout 132 corresponds to a pattern of features 134 to be formed as trenches in a negative photoresist on a wafer. The layout 132 corresponds to a design pattern for metal lines to be formed in a wafer 116. In a double exposure EUV process, the pattern of the layout 132 is implemented using a first bright field reticle 101a and a second bright field reticle 101b.

FIG. 2B is a simplified top view of a first bright field reticle 101a, in accordance with some embodiments. The first bright field reticle 101a includes a pattern 113a of the absorption material 136. The pattern 113a corresponds to a first portion of the pattern of the layout 132. The first reticle 101a includes the additional absorption area 115a and the black border area 120a. The material of the additional absorption area 115a is the same as the absorption material 136 defining the pattern 113a. The additional absorption area 115a abuts the black border area 120a and is contiguous with at least a portion of the absorption material 136 of the pattern 113a.

FIG. 2C is a simplified top view of a second bright field reticle 101b, in accordance with some embodiments. The second bright field reticle 101b includes a pattern 113b of the absorption material 136. The pattern 113b corresponds to a second portion of the pattern of the layout 132. The second reticle 101b includes the additional absorption area 115b and the black border area 120b. The material of the additional absorption area 115b is the same as the absorption material 136 defining the pattern 113b. The additional absorption area 113b abuts the black border area 120b and is contiguous with at least a portion of the absorption material 136 of the pattern 113b. The pattern 113a and the pattern 113b overlap each other and collectively make up the complete pattern of the layout 132.

Figure 2D:
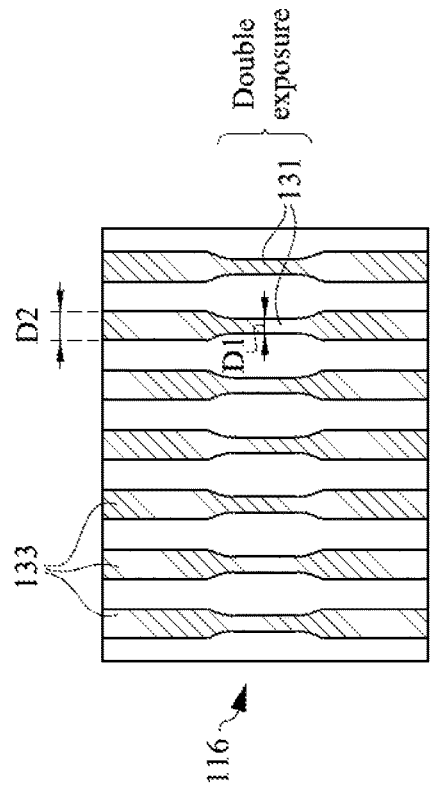

FIG. 2D illustrates a portion of a wafer 116 on which the pattern 132 has been formed, in accordance with some embodiments. The features 133 correspond to locations at which metal lines will be formed or have been formed in accordance with the layout 132. In practice, the features 133 may correspond to locations at which trenches have been formed in a layer of photoresist on the wafer 116 after the double exposure process. The metal lines can be formed in place of the trenches. FIG. 2D illustrates a double exposure area in which the features 133 have a width dimension D1. FIG. 2D also illustrates single exposure areas in which the features 133 have a width dimension D2. Further, there is a narrower feature 131 in the double exposure area. Notably, due to the presence of the additional absorption areas 115a/b, there are no undesired breaks in the features 133. This is in contrast to another possible solution shown in relation to FIGS. 2E-2H.

FIG. 2E illustrates a layout 132 including a pattern of features 134, substantially identical to the layout 132 of FIG. 2A. FIG. 2F illustrates a first bright field reticle 201a including a pattern of absorption material 236 and a black border area 220a. The first reticle 201a includes a pattern forbidden area 222a in which there is no absorption material between the black border area 220a and the pattern of absorption material 236. FIG. 2G illustrates a second bright field reticle 201b including a pattern of absorption material 236 and a black border area 220b. The second reticle 201b includes a pattern forbidden area 222b in which there is no absorption material between the pattern and the black border area 220b. In other words, the additional absorption area 115a/b is not present in the reticles 201a/b.

FIG. 2H illustrates a wafer 216 that has been patterned with a double exposure EUV process utilizing the reticles 201a and 201b. Further, there is a narrower feature 231 in the double exposure area. Notably, the features 233 include breaks at the locations corresponding to the forbidden areas 222a/b. In other words, the pattern of the layout 132 has not been acceptably rendered on the wafer 216 due to the presence of the breaks. Therefore, the solution shown in relation to FIGS. 2B-2D overcomes the drawbacks of the potential solution shown in FIGS. 2F-2H due to the presence of the additional absorption areas 115a/b.

FIG. 3A-3K are cross-sectional views of a bright field EUV reticle 101a at various stages of processing, in accordance with some embodiments. The process illustrated in relation to FIGS. 3A-3K can be utilized to form the EUV reticles 101a and 101b having the additional absorption area 115a/b adjacent to the black border areas 120a/b as described in relation to FIGS. 1A-2D, and as further described in subsequent figures.

Figures 3A, 3B, 3C:
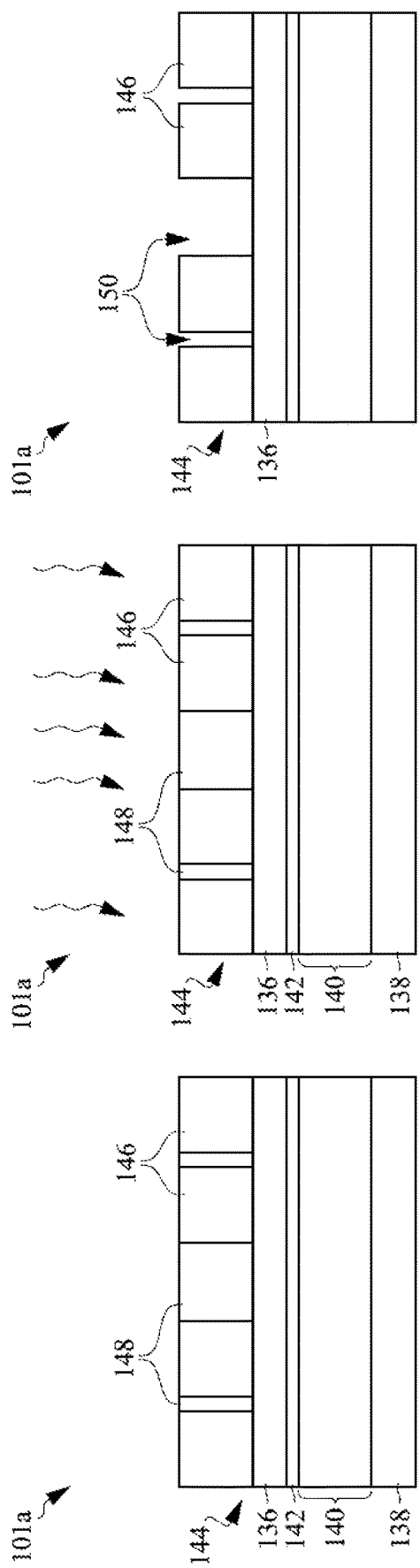

In FIG. 3A, the EUV reticle 101a includes a substrate 138, a reflective multilayer 140 on the substrate 138, and the buffer layer 142 on the reflective multilayer 140 (also called a set of reflective layers 140). The EUV reticle 101a also includes absorption material 136 on the buffer layer 142. The EUV reticle 101a also includes a layer of photoresist 144 on the absorption material 136.

The fabrication process of the reticle 101a eventually results in the reticle 101a having a selected pattern in the absorption material 136.

The substrate 138 includes a low thermal expansion material. The low thermal expansion material substrate 138 serves to minimize image distortion due to heating of the reticle 101a. The low thermal expansion material substrate 138 can include materials with a low defect level and a smooth surface.

In one embodiment, the substrate 138 can include $SiO_2$. The substrate 138 can be doped with titanium dioxide. The substrate 138 can include other low thermal expansion materials than those described above without departing from the scope of the present disclosure.

Though not shown herein, in one embodiment the substrate 138 may be positioned on a conductive layer. The conductive layer can assist in electrostatically chucking the reticle 101a during fabrication and use of the reticle 101a. In one embodiment, the conductive layer includes chromium nitride. The conductive layer can include other materials without departing from the scope of the present disclosure.

The reticle 101a includes the reflective multilayer 140. The reflective multilayer 140 is positioned on the substrate 138. The reflective multilayer 140 is configured to reflect the extreme ultraviolet light during photolithography processes in which the reticle 101a is used. The reflective properties of the reflective multilayer 140 are described in more detail below.

In one embodiment, the reflective multilayer 140 operates in accordance with reflective properties of the interface between two materials. In particular, reflection of light will occur when light is incident at the interface between two materials of different refractive indices. A greater portion of the light is reflected when the difference in refractive indices is larger.

One technique to increase the proportion of reflected light is to include a plurality of interfaces by depositing a multilayer of alternating materials. The properties and dimensions of the materials can be selected so that constructive interference occurs with light reflected from different interfaces. However, the absorption properties of the employed materials for the plurality of layers may affect the reflectivity that can be achieved.

Accordingly, the reflective multilayer 140 includes a plurality of pairs of layers. Each pair of layers includes a layer of a first material and a layer of a second material. The materials and thicknesses of the layers are selected to promote reflection and constructive interference of extreme ultraviolet light.

In one embodiment, each pair of layers includes a layer of molybdenum and a layer of silicon. In one example, the layer of molybdenum is between 2 nm and 4 nm in thickness. In one example, the layer of silicon is between 3 nm and 5 nm in thickness. The thicknesses of the layers in the reflective multilayer 140 are selected based on the expected wavelength of extreme ultraviolet light used in the photolithography processes and the expected angle of incidence of the extreme ultraviolet light during the photolithography processes. The wavelength of the extreme ultraviolet light is between 1 nm and 20 nm. The number of pairs of layers is between 20 pairs of layers and 60 pairs of layers, according to one embodiment. Other materials, thicknesses, numbers of pairs, and configurations of layers in the reflective multilayer 140 can be utilized without departing from the scope of the present disclosure. Other wavelengths of extreme ultraviolet light can be used without departing from the scope of the present disclosure.

In one embodiment, the buffer layer 142 is positioned on the reflective multilayer 140. One purpose of the buffer layer 142 is to protect the reflective multilayer during etching processes of the absorption material 136. Accordingly, the buffer layer 142 includes materials that are resistant to etching by etching processes that etch the absorption material 136. The etching processes and the materials of the absorption layer will be described in more detail below.

In one embodiment, the buffer layer 142 includes ruthenium. The buffer layer 142 can include compounds of ruthenium including ruthenium boride and ruthenium silicide. The buffer layer 142 can include chromium, chromium oxide, or chromium nitride. The buffer layer 142 can be deposited by a low temperature deposition process to prevent diffusion of the buffer layer 142 into the reflective multilayer 140. In one embodiment, the buffer layer 142 has a thickness between 2 nm and 4 nm. Other materials, deposition processes, and thicknesses can be utilized for the buffer layer 142 without departing from the scope of the present disclosure.

The absorption material 136 is positioned on the buffer layer 142. The material of the absorption material 136 is selected to have a high absorption coefficient for wavelengths of extreme ultraviolet radiation that will be used in the photolithography processes with the reticle 101a. In other words, the materials of the absorption material 136 are selected to absorb extreme ultraviolet radiation.

In one embodiment, the absorption material 136 is between 25 nm and 100 nm in thickness. In one embodiment, the absorption material 136 includes material selected from a group including chromium, chromium oxide, titanium nitride, tantalum nitride, tantalum, titanium, aluminum-copper, palladium, tantalum boron nitride, tantalum boron oxide, aluminum oxide, molybdenum, or other suitable materials. Other materials and thicknesses can be used for the absorption material 136 without departing from the scope of the present disclosure.

In one embodiment, the absorption material 136 includes a first absorption layer and a second absorption layer. The first absorption material 136 is positioned on the buffer layer 142. The second absorption layer is positioned on the first absorption layer.

In one embodiment, the first absorption layer includes tantalum boron nitride. The second absorption layer includes tantalum boron oxide. The thickness of the first absorption layer is between 30 nm and 80 nm. The thickness of the second absorption layer is between 1 nm and 40 nm. The absorption material 136 can include different materials, thicknesses, and numbers of layers than those described above without departing from the scope of the present disclosure. In one embodiment, the absorption material 136 includes only a single absorption layer, and is not limited thereto. Accordingly, the absorption material 136 can be an absorption layer.

The layers of the reticle 101a shown in FIG. 3A may be formed by various thin-film deposition processes. The thin-film deposition processes can include including physical vapor deposition process such as evaporation and DC magnetron sputtering, a plating process such as electroless plating or electroplating, a chemical vapor deposition process such as atmospheric pressure chemical vapor deposition, low pressure chemical vapor deposition, plasma enhanced chemical vapor deposition, high density plasma chemical vapor deposition, ion beam deposition, spin-on coating, metal-organic decomposition, and/or other methods known in the art.

In FIG. 3A, the layer of photoresist 144 has been exposed, via a mask, to irradiation. The irradiation can include bombardment via electron-beam. Alternatively, the irradiation can include irradiation by ultraviolet light or other types of electromagnetic radiation that can be used to pattern photoresist. The results of the radiation via a mask are that the photoresist 144 includes exposed areas 148 and the unexposed areas 146. The exposed areas 148 and the unexposed areas 146 define a pattern in accordance with the mask used. As will be set forth in more detail below, the pattern of exposed areas 148 and unexposed areas 146 will also define the pattern 113a of absorption material 136 on the reticle 101a. Alternatively, depending on the type of photoresist 144, the pattern 113a may be imparted by reversing the locations of the unexposed areas 146 and exposed areas 148.

In FIG. 3B, a heating process has been performed. The heating process can include a thermal annealing process, a baking process, or another type of process in which the temperature of the photoresist 144 is elevated for a selected duration of time. The heating process results in a transformation in the exposed areas 148 of the photoresist 144. As will be set forth in more detail below, the transformation of the exposed areas 148 will enable selective removal of the exposed areas 148 with respect to the unexposed areas 146.

In FIG. 3C, a developing process has been performed. The developing process can include depositing a developer on the layer of photoresist 144. The developer selectively removes the exposed areas 148 of the photoresist 144 with respect to the unexposed areas 146 of the photoresist 144. The result is that after the development process, only the unexposed areas 146 of the photoresist 144 may remain. The development process can be performed via etching, irradiation, or other types of processes that can selectively readily remove the exposed areas 148 with respect to the unexposed areas 146. After the development process trenches 150 have been formed in the photoresist 144. The trenches 150 correspond to areas at which the absorption material 136 will be removed, as will be set forth in more detail below.

In FIG. 3D an etching process has been performed, in accordance with some embodiments. The etching process removes the absorption material 136 at the location of the trenches 150. In other words, the etching process removes the absorption material 136 at the locations that are not covered by the remaining portions of the layer of photoresist 144. Accordingly, the trenches 150 have been extended to expose the buffer layer 142. The etching process can include an anisotropic etching process that selectively etches in the downward direction. The etching process selectively removes the absorption material 136 with respect to the buffer layer 142 and the layer of photoresist 144. The etching process can include a wet etch, a dry etch, a timed etch, or other types of etching processes.

In FIG. 3E the photoresist 144 has been removed, in accordance with some embodiments. The photoresist 144 can be removed via a stripping process, an etching process, an ashing process, or other types of removal processes. After removal of the photoresist 144, the absorption material 136 forms a pattern 113a. The pattern 113a can correspond to a first portion of the layout 132. Furthermore, peripheral to the pattern 113a, sub resolution assist features (SRAF) 151 remain in the absorption material 136. The SRAFs 151 correspond to features that may not be imparted onto the wafer but may assist in imparting the features of the pattern 113a onto the wafer 116.

In FIG. 3F, a layer of photoresist 154 has been deposited on the absorption material 136 and on the exposed portions of the buffer layer 142. The layer photoresist 144 has been exposed, via a mask, to irradiation. The irradiation can include bombardment via electron-beam. Alternatively, the irradiation can include irradiation by ultraviolet light or other types of electromagnetic radiation that can be used to pattern photoresist. The results of the radiation via a mask are that the photoresist 154 includes exposed areas 158 and unexposed areas 156. The exposed areas 158 and the unexposed areas 156 define a pattern in accordance with the mask used. As will be set forth in more detail below, the pattern of exposed areas 158 and unexposed areas 156 will also define the pattern of the black border area 120a of the reticle 101a.

In FIG. 3G, a heating process has been performed. The heating process can include a thermal annealing process, a baking process, or another type of process in which the temperature of the photoresist 154 is elevated for a selected duration of time. The heating process results in a transformation in the exposed areas 158 of the photoresist 154. As will be set forth in more detail below, the transformation of the exposed areas 158 will enable selective removal of the exposed areas 158 with respect to the unexposed areas 156.

In FIG. 3H, a developing process has been performed. The developing process can include depositing a developer on the layer of photoresist 154. The developer selectively removes the exposed areas 158 of the photoresist 154 with respect to the unexposed areas 156 of the photoresist 154. The result is that after the development process, only the unexposed areas 156 of the photoresist 154 may remain. The development process can be performed via etching, irradiation, or other types of processes that can selectively remove the exposed areas 158 with respect to the unexposed areas 156. After the development process trenches 160 have been formed in the photoresist 154. The trenches 160 correspond to areas at which the absorption material 136 will be removed, as will be set forth in more detail below.

In FIG. 3I an etching process has been performed, in accordance with some embodiments. The etching process removes the absorption material 136, the buffer layer 142, and the reflective multilayer 140 at the location of the trenches 160. In other words, the etching process removes the absorption material 136, the buffer layer 142, and the reflective multilayer 140 at the locations that are not covered by the remaining portions of the layer of photoresist 154. Accordingly, the trenches 160 have been extended to expose the substrate 138. The etching process can include an anisotropic etching process that selectively etches in the downward direction. The etching process selectively removes the absorption material 136, the buffer layer 142, and the reflective multilayer 140 with respect to the substrate 138. The etching process can include a wet etch, a dry etch, a timed etch, or other types of etching processes. The etching process can include a plurality of etching processes that each selectively etch one of the materials to be etched.

In FIG. 3J the photoresist 154 has been removed, in accordance with some embodiments. The photoresist 154 can be removed via a stripping process, an etching process, an ashing process, or other types of removal processes. The trenches 160 correspond to the black border regions 120a.

The black border regions 120a are abutted by the additional absorption area 115a. Further details regarding the black border regions 120a and the additional absorption areas 115a are described in relation to FIG. 3K.

Figure 3K:
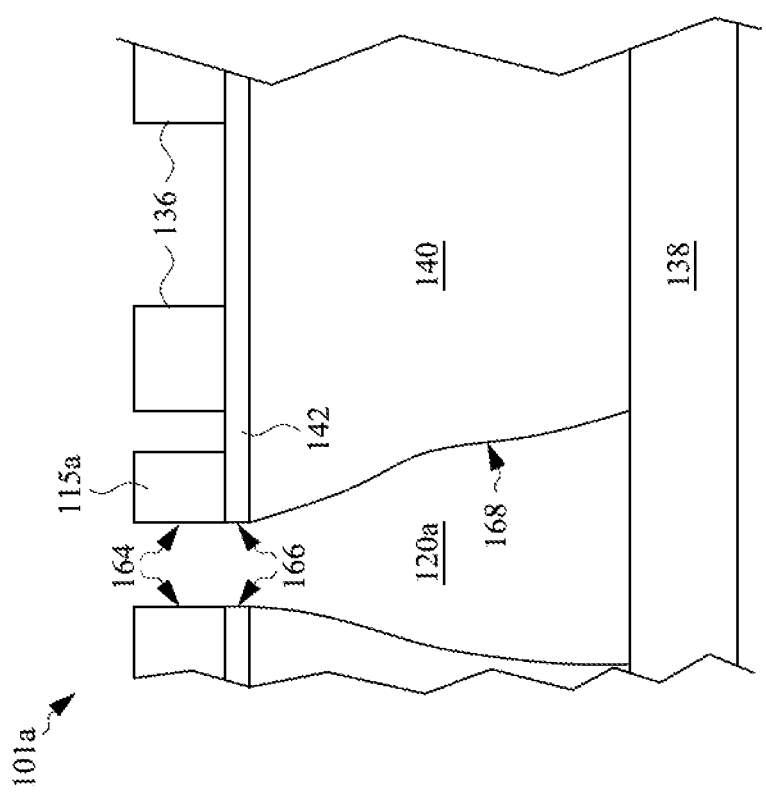

FIG. 3K illustrates an enlarged cross-sectional view of a portion of the reticle 101a at the stage of processing of FIG. 3J, in accordance with some embodiments. In particular, FIG. 3K illustrates one potential issue associated with formation of the black border area 120a. In particular, etching of the reflective multilayer 140 during formation of the black border area 120a may result in an uneven profile of the sidewall 168 of the reflective multilayer 140. Whereas the sidewall 164 of the additional absorption area 115 a and the sidewall 166 of the buffer layer 142 at the black border area are substantially vertically straight or flat, the sidewall 168 of the reflective multilayer 140 is not substantially straight. Furthermore, the reflective multilayer 140 may substantially widen closer to the top surface of the substrate 138. This results in an overhang region in which the upper portions of the reflective multilayer 140 and the buffer layer 142 and the additional absorption area 115a overhang a gap formed by the concavity of the sidewall 168 of the reflective multilayer 140.

The potential presence of the overhang region is one reason why the pattern area 113a does not extend closer to the black border area 120a. In particular, the lower portions of the reflective multilayer 140 may not be present near the edges of the black border area 120a. For this reason, and the potential solution shown in relation to FIGS. 2F-2H, the pattern forbidden area 222a/b is present. However, the reticle 101a of FIG. 3K includes the additional absorption area 115a is present where the pattern forbidden area would otherwise be. This results in more reliable formation of features on the wafer 116 have been there are pitches, as described previously.

While FIGS. 3A-3K describe formation of a first reticle 101a, the second reticle 101b can be formed in the same manner using the same structures or components, and processes.

Figure 4A:
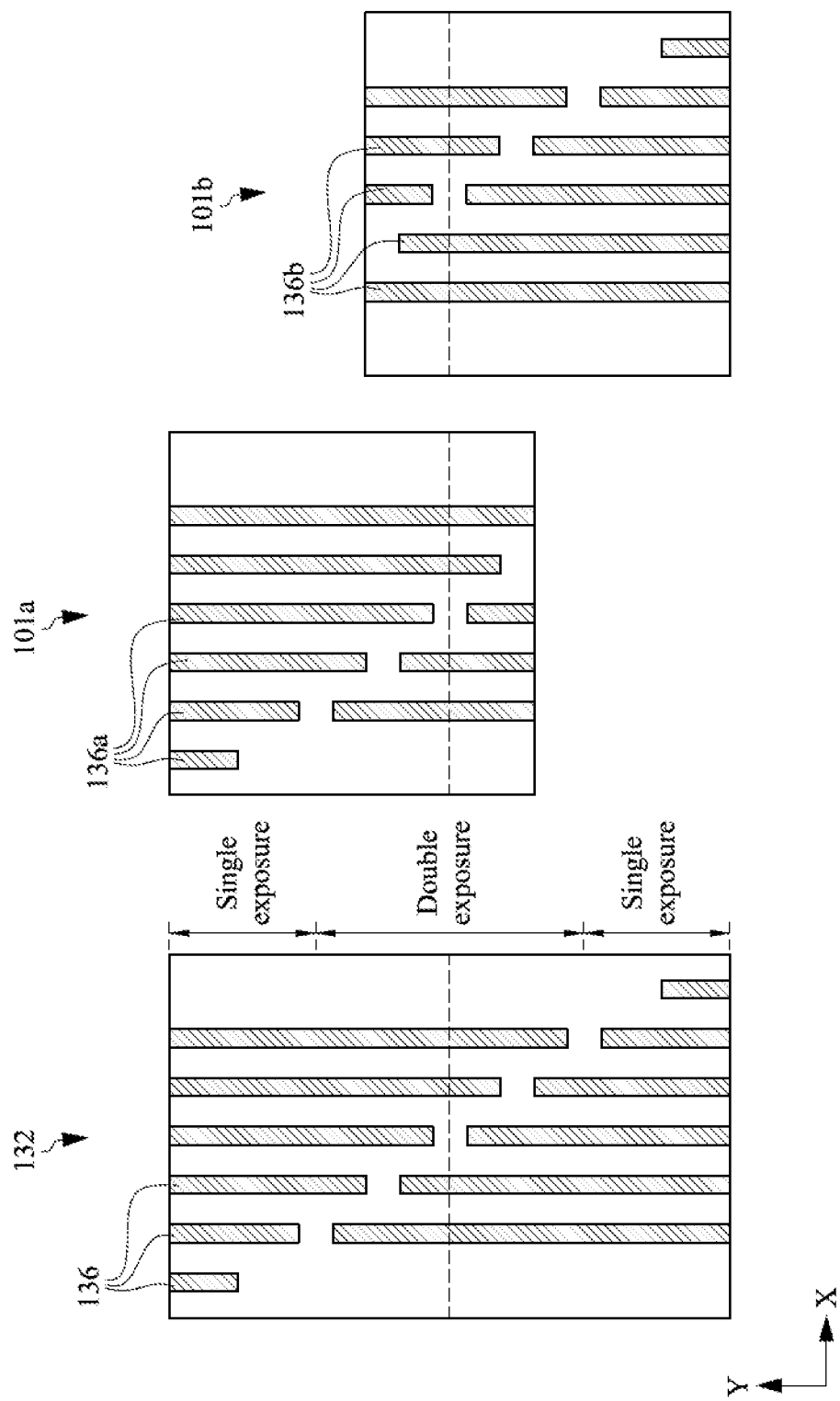
FIGS. 4A-4F are top views of layouts illustrating a design process for double exposure EUV reticles, in accordance with some embodiments.

FIGS. 4A-4F represent the process for designing first and second reticles 101a/b prior to fabrication of the reticles 101a/b, in accordance with some embodiments. FIG. 4A illustrates a layout 132 illustrating the pattern of features 136 to be formed on an integrated circuit, in accordance with some embodiments. The layout 132 is to be implemented via a double exposure process. As the layout 132 will be implemented via a double exposure process, patterns for two reticles 101a/b are initially extracted from the layout 132, as shown in FIG. 4A. In some embodiments, the dimension of the pattern 132 in the Y direction is between 30 mm and 35 mm. In some embodiments, the sum of lengths of one single exposure area and the double exposure area is greater than half the total length of the pattern 132 in the Y direction. In some embodiments, the pattern 132 has a width in the X direction between 20 mm and 30 mm. The pattern 132 can be utilized for metal line pitches or other feature pitches less than 30 nm. Furthermore principles of the present disclosure provide for higher image contrast of dense pitches and higher throughput.

Figure 4B:
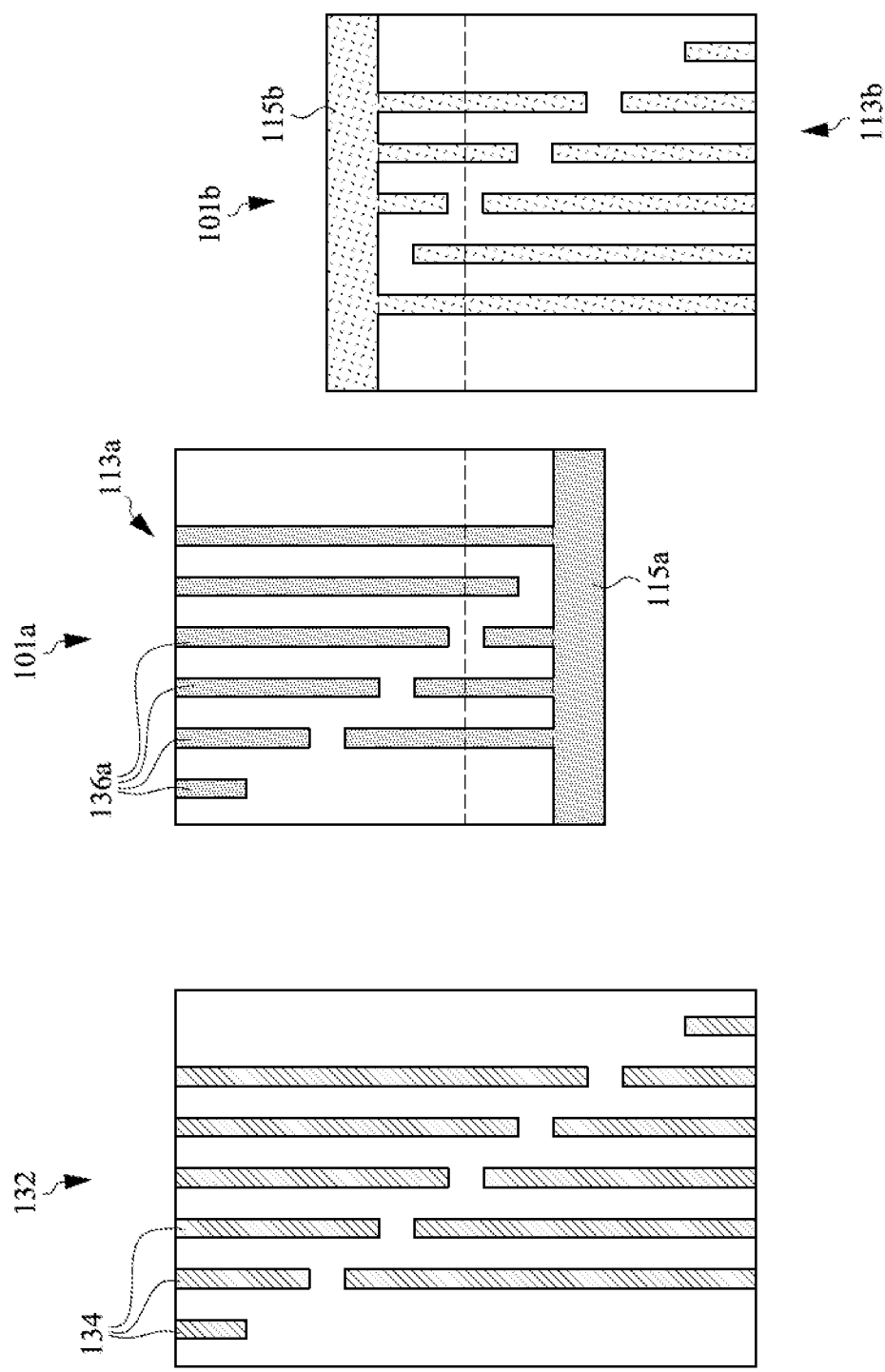
Figure 4C:
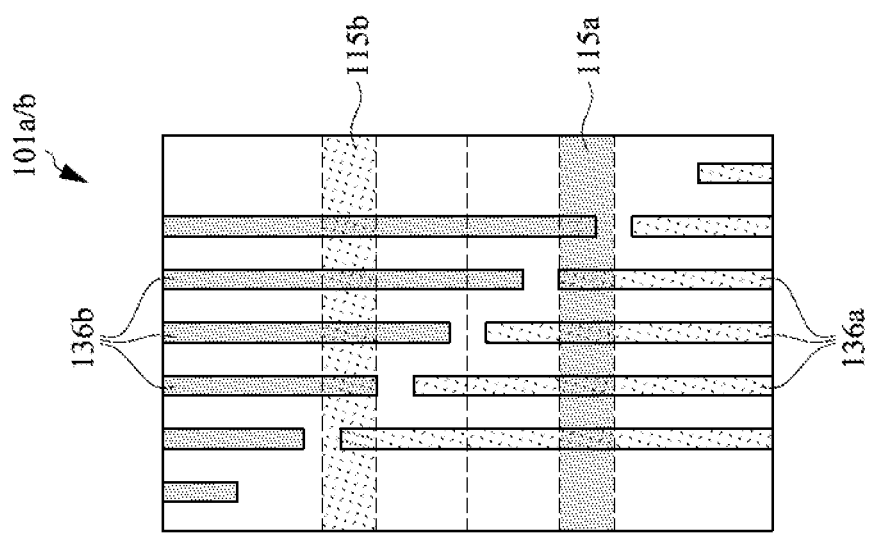
Figure 4C:
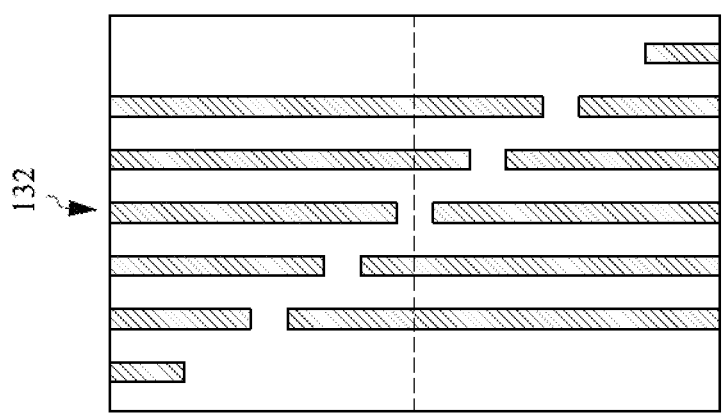

In FIG. 4B, the additional absorption areas 115a/b are added to the layouts for the reticles 101a/b. In FIG. 4C, the layouts of the masks 101a/b are overlaid with each other. The overlay illustrates the positions of the additional absorption areas 115a/b. In the initial overlay of FIG. 4C, the absorption material 136a/b have the same with dimensions inside and outside of the double exposure area.

Figure 4D:
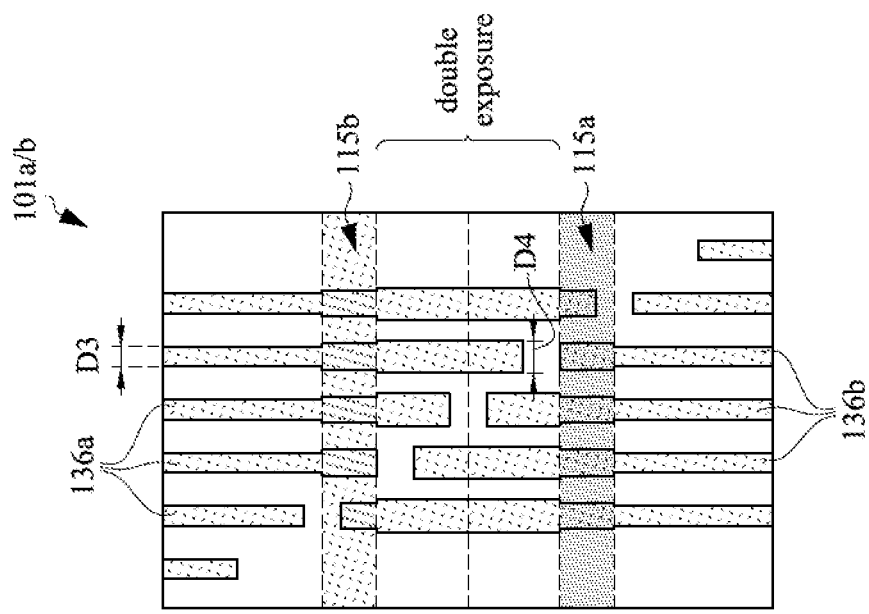
Figure 4D:
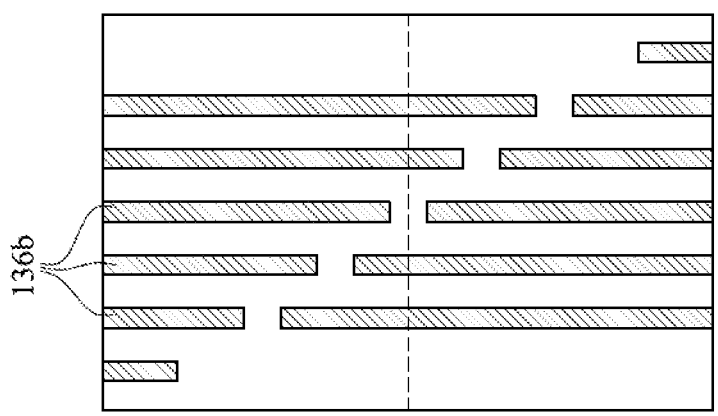

In FIG. 4D, an optical and process correction (OPC) process is performed to adjust the layouts of the reticles 101a/b, in accordance with some embodiments. The OPC process adjusts the width dimensions of the layouts for the absorption material 136a/b within the double exposure area. The reason for this is that it is possible that the features formed in a wafer at the double exposure areas may be significantly decreased in width from the layouts. Accordingly, slightly widening the features within the double exposure area results in features formed in the wafer having acceptable widths. As can be seen, features outside the double exposure area have a width dimension D3. Features within the double exposure area have a width dimension D4, slightly larger than the width dimension D3.

Figure 4E:
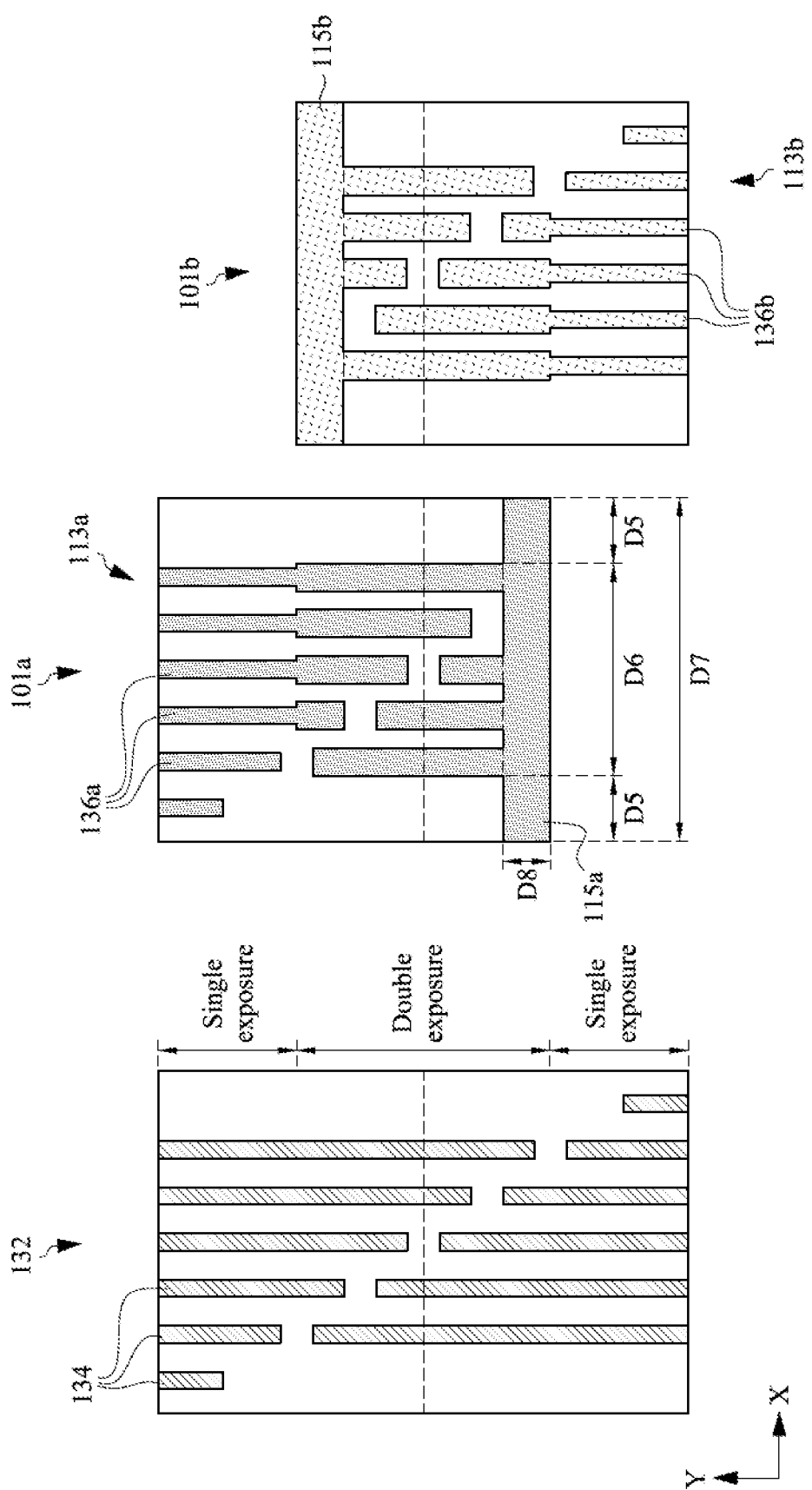

In FIG. 4E, the layouts of the reticles 101a/b are separated, in accordance with some embodiments. This corresponds to the final layout for the reticles 101a/b. After this, the reticles can be fabricated utilizing a process as described in relation to FIGS. 3A-3K.

The patterning region may have a width dimension D6. The width dimension D6 may be between 20 mm and 30 mm, though other dimensions may be utilized without departing from the scope of the present disclosure. The additional absorption area may be wider than the patterning area on each side by a dimension D5. The dimension D5 may be between 1 nm and 10 nm, though other dimensions may be utilized without departing from the scope of the present disclosure. The width of the additional absorption area 115a/b may have a dimension D7. The dimension D7 may be the sum of the dimension D6 and twice the dimension D5. The additional absorption area 115a/b may have a length dimension D8. The length dimension D8 may be between 10 nm and 1000 nm, though other dimensions may be utilized without departing from the scope of the present disclosure.

Figure 4F:
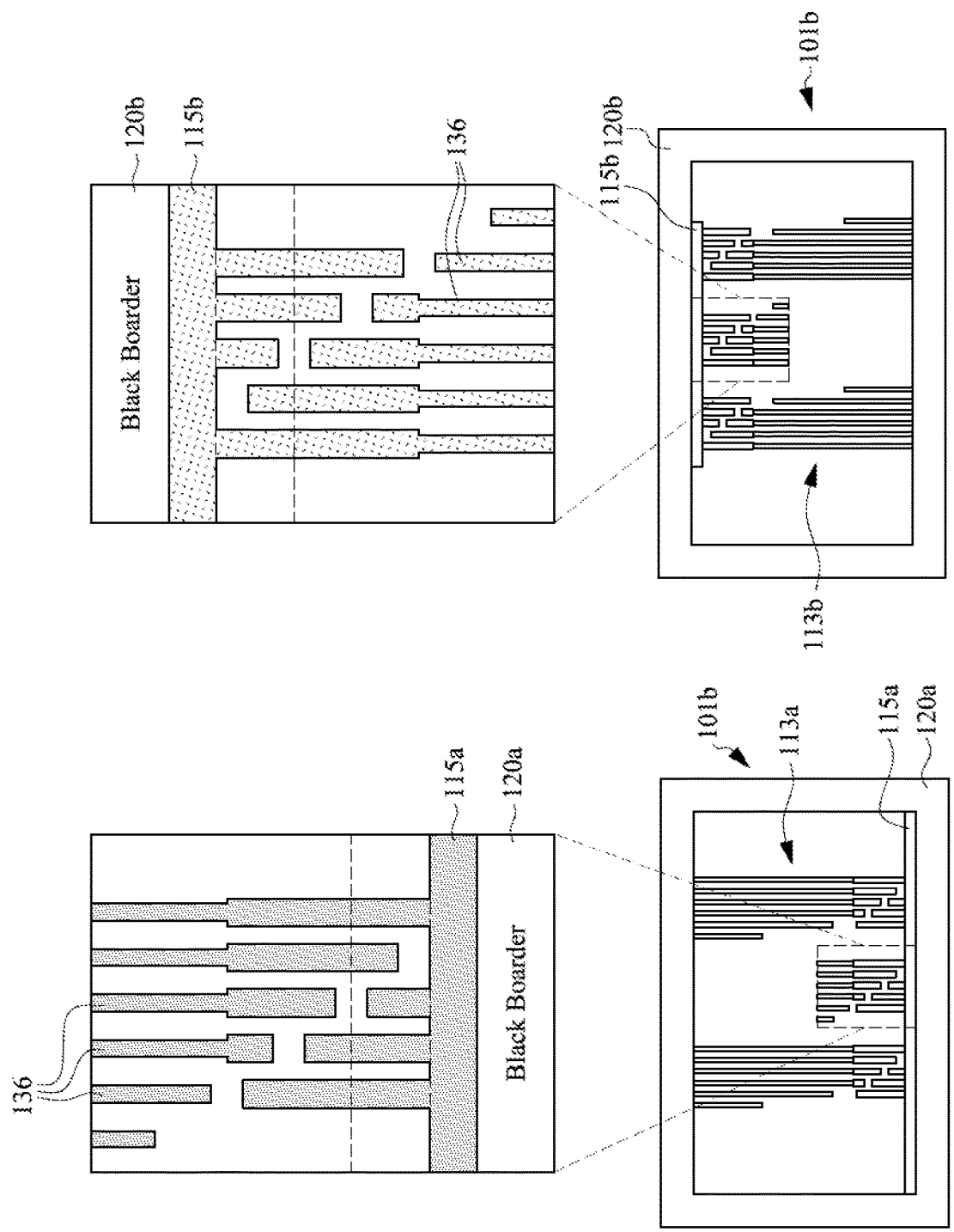

FIG. 4F illustrates that the entire reticles 101a and 101b may be larger than the patterns shown in FIG. 4E in some embodiments. In particular, the black border region 120a/b may completely surround the pattern areas 113a/b. The additional absorption areas 115a/b may be located only at one end of the reticles 101a/b in some embodiments.

Figure 4G:
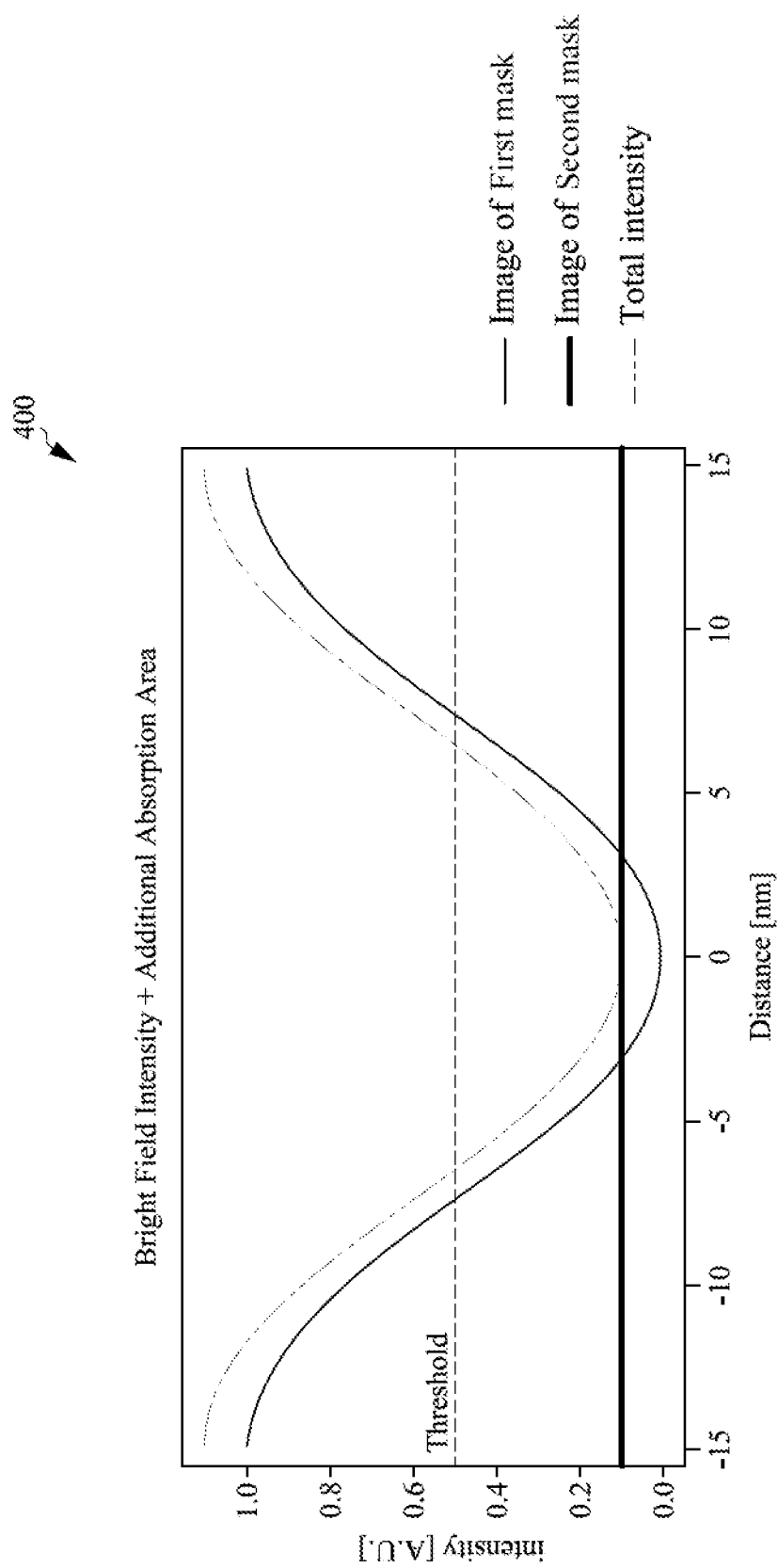
FIG. 4G is a graph illustration image intensity for double exposure reticles, in accordance with some embodiments.

FIG. 4G is a graph illustrating the exposure intensity of double exposure reticles 101a/b in accordance with some embodiments. The graph 400 illustrates the intensity of the image from the reticle 101a, the intensity of the image from the reticle 101b, and the total intensity. The graph 400 illustrates that the double exposures are resolvable.

Designing and implementing double exposure reticles in accordance with principles of the present disclosure is a cost-effective and easy method to implement bright field imaging with high-NA EUV scanners. While embodiments herein may describe reticles 101a/b being implemented in conjunction with patterns for metal lines, principles of the present disclosure can be utilized for reticles for any layer or for any feature patterns in a wafer regardless of the orientation of the patterns. Furthermore, designing double exposure reticles in accordance with principles of the present disclosure can be accomplished in accordance with simulation software such as OPC simulation software or source mask optimization (SMO) software. Furthermore principles of the present disclosure can obviate the use of expensive new mass development processes.

Figure 5A:
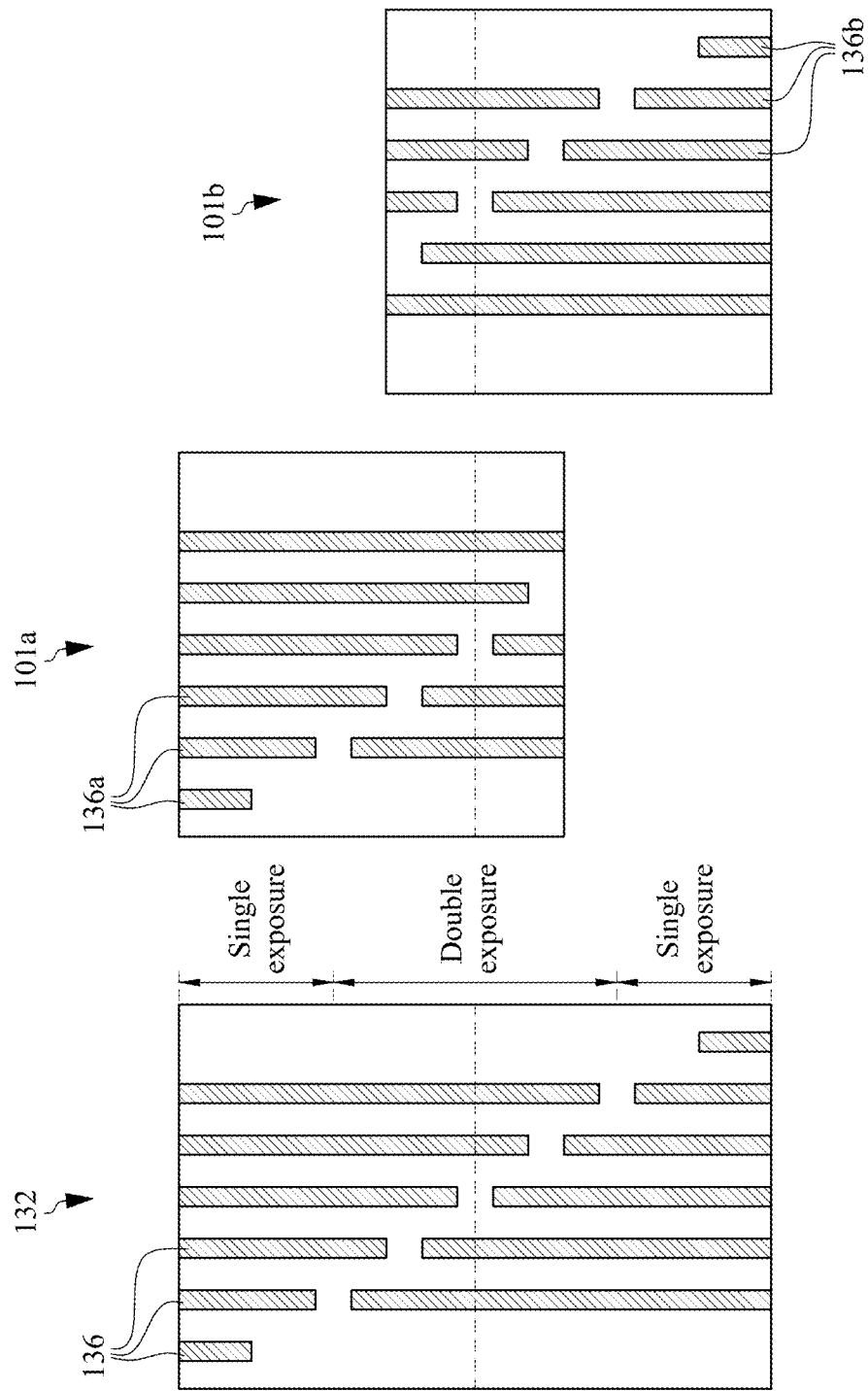
FIGS. 5A-5F are top views of layouts illustrating a design process for double exposure EUV reticles, in accordance with some embodiments.

FIGS. 5A-5E illustrate a process for designing reticles 101a/b, in accordance with some embodiments. FIG. 5A illustrates a layout 132 and initial layouts for the masks 101a/b substantially similar to FIG. 4A.

Figure 5B:
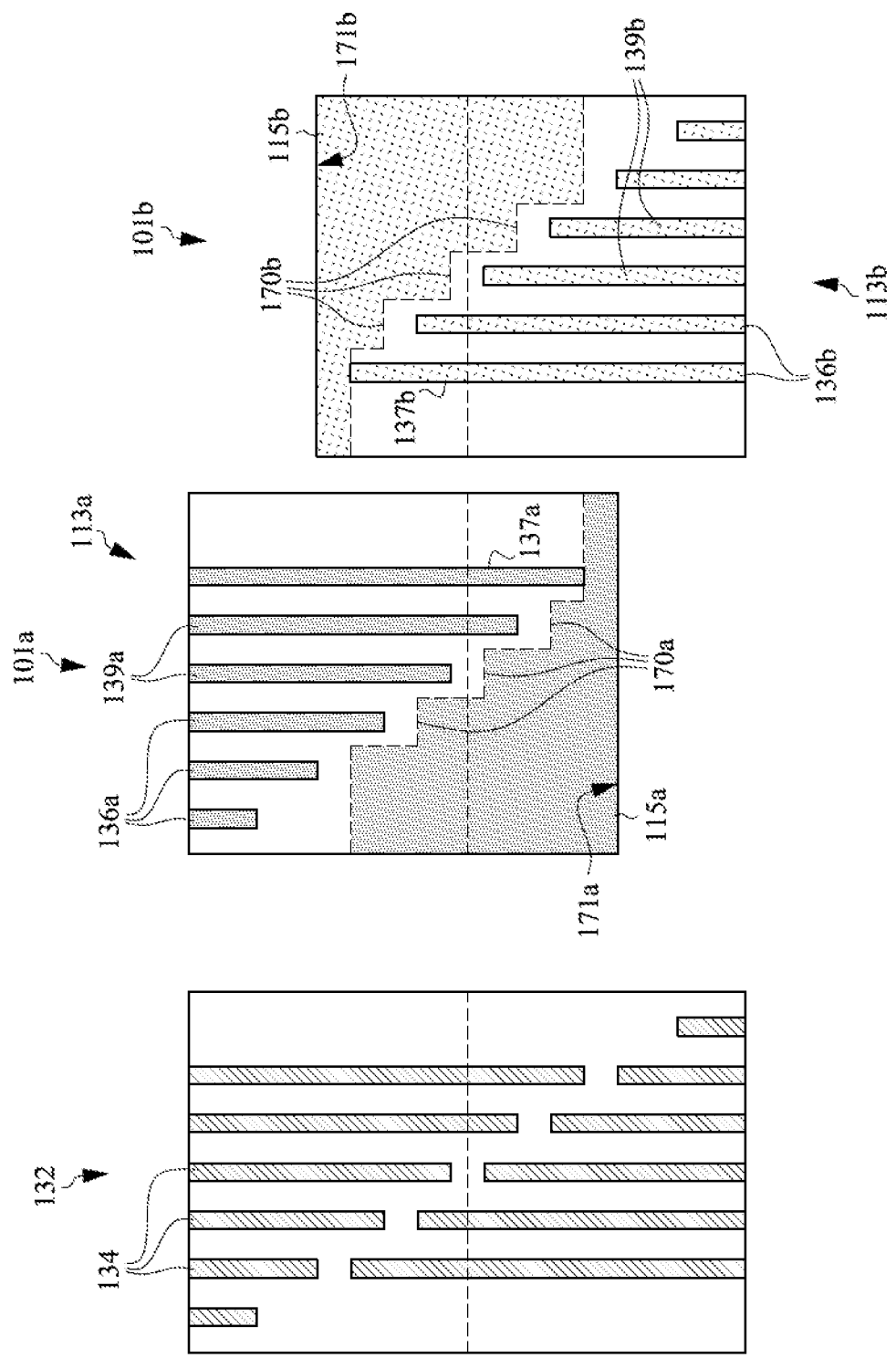

In FIG. 5B, the additional absorption areas 115a/b have been added to the design of the reticles 101a/b. The layouts of the reticles 101a/b of FIG. 5B and the reticles 101a/b may be substantially similar as shown in FIG. 4B, except for the configuration of the additional absorption areas 115a/b. In particular, the additional absorption areas 115a/b have uneven profiles near the absorption material 136a/b. While the lateral edge 171a/b adjacent to the black border area 120a/b is substantially straight, the opposite side of the additional absorption areas 115a/b has stepped structures 170a/b. A first strip 137a/b of absorption material 136a is contiguous with them in direct contact with the additional absorption area 115a/b. Other strips 139a/b of the absorption material 136a/b are not in contact with the stepped structures 170a/b of the additional absorption areas 115a/b.

Figure 5C:
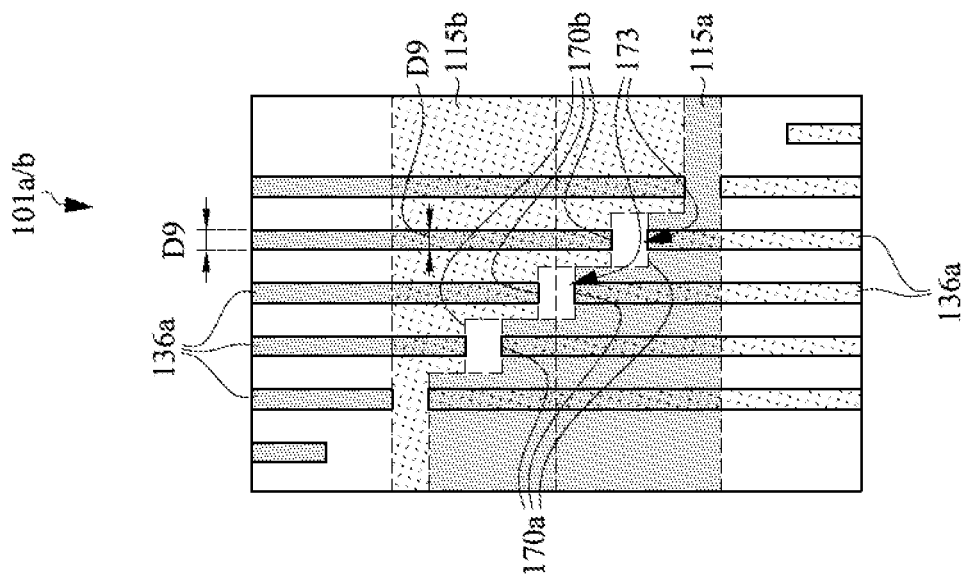
Figure 5C:
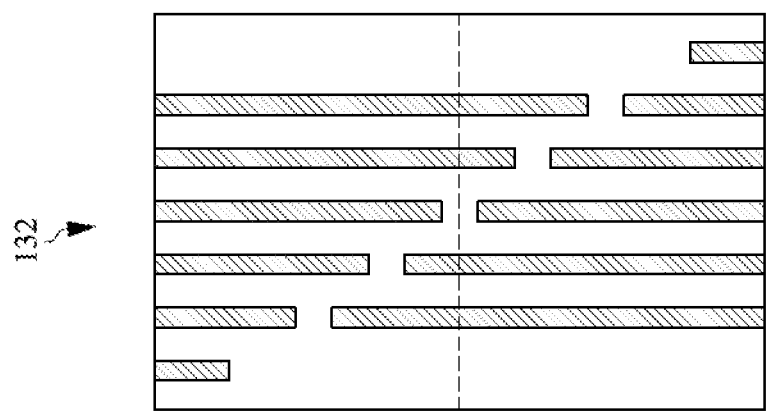

FIG. 5C illustrates the layout 132 of FIG. 5B and the first and second reticles 101a/b overlaid with each other, in accordance with some embodiments. The additional absorption areas 115a/b do not overlap with each other, though they abut each other. The stepped structures 170a/b fit together in the overlay without overlapping. In the overlay, gaps 173 correspond to areas at which the additional absorption areas 115a/b do not abut each other. The absorption material 136a/b has a width dimension D9 that is substantially uniform both inside and outside the double exposure area.

Figure 5D:
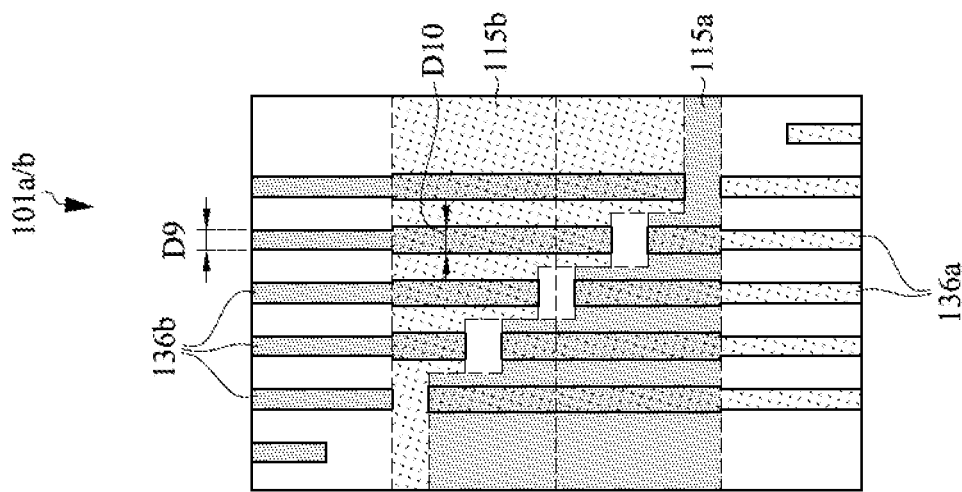
Figure 5D:
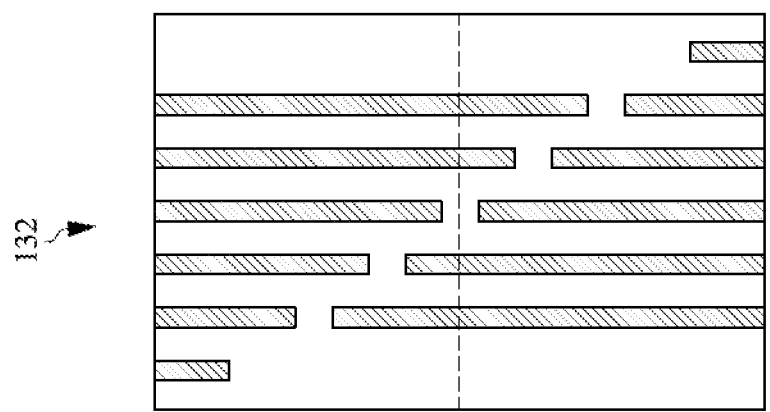

In FIG. 5D, an OPC process is performed to adjust the layouts of the reticles 101a/b, in accordance with some embodiments. The OPC process adjusts the width dimensions of the layouts for the absorption material 136a/b within the double exposure area. The reason for this is that it is possible that the features formed in a wafer at the double exposure areas may be significantly decreased in width from the layouts. Accordingly, slightly widening the features within the double exposure area results in features formed in the wafer having acceptable widths. As can be seen, features outside the double exposure area have a width dimension D9. Features within the double exposure area have a width dimension D10, slightly larger than the width dimension D9.

Figure 5E:
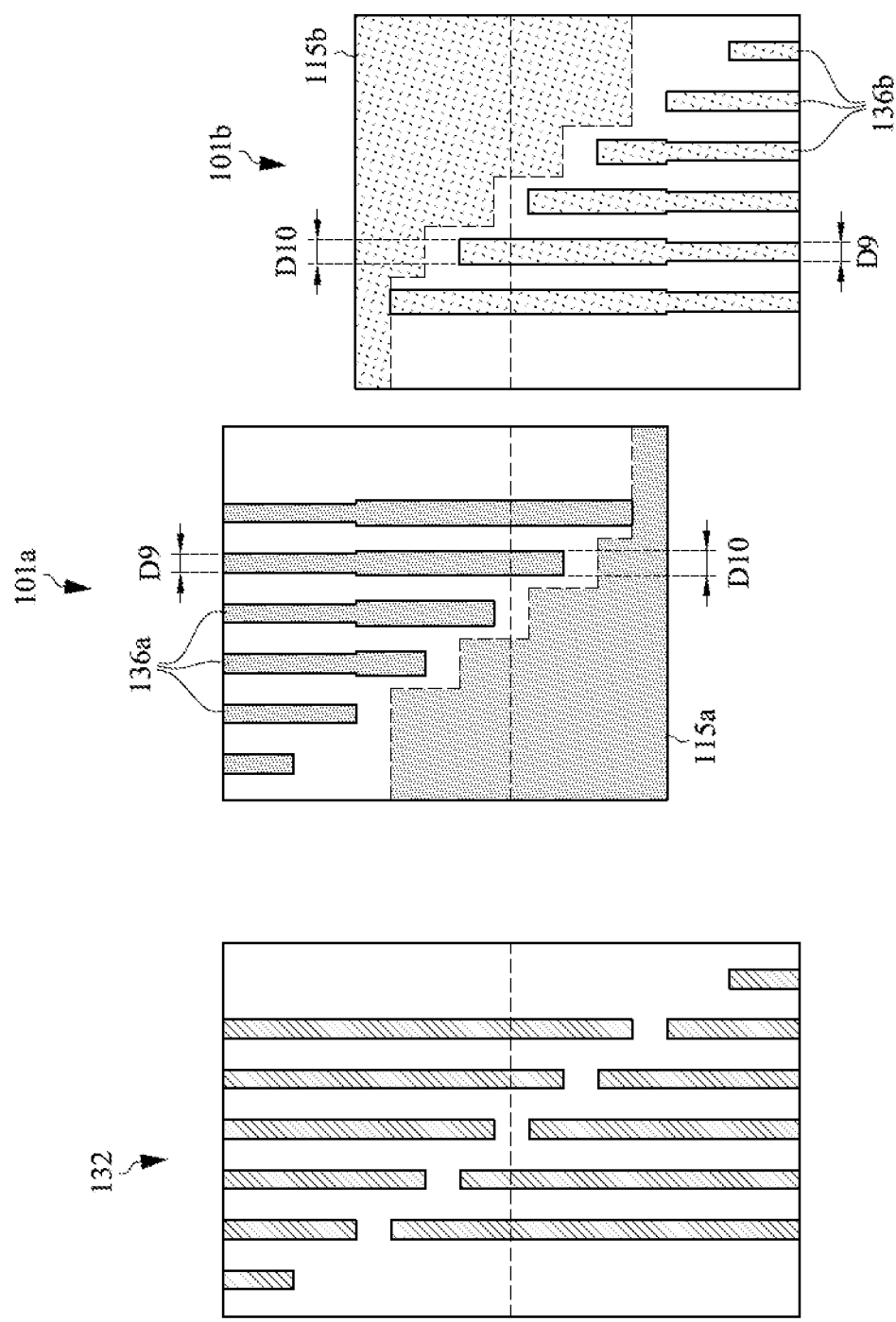

In FIG. 5E, the layouts of the reticles 101a/b of FIG. 5E are separated, in accordance with some embodiments. This corresponds to the final layout for the reticles 101a/b. After this, the reticles can be fabricated utilizing a process as described in relation to FIGS. 3A-3K. The shape of the additional absorption area can be well-designed for reducing layout optimization complexity or for maximizing the process window. Furthermore, the shape of the additional absorption area 115a/b is designed to simplify the target of an individual reticle so that no end-to-end pattern is shown.

Figure 5F:
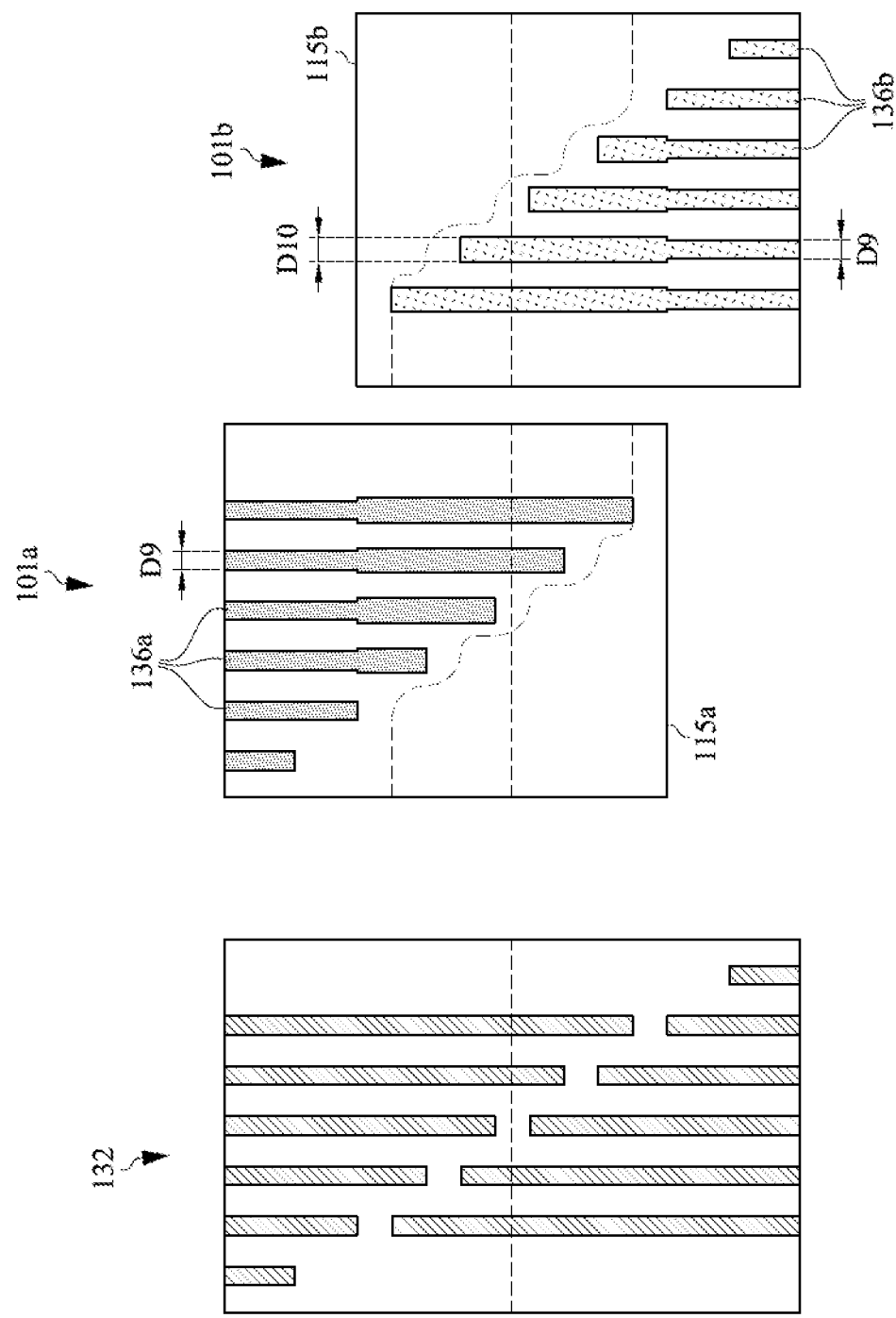

In FIG. 5F, the edge of the additional absorption area 115a/b has a curvilinear edge rather than a sharply stepped edge as shown in FIG. 5E, in accordance with some embodiments. Accordingly, various shapes and profiles can be utilized for the absorption area 115a/b without departing from the scope of the present disclosure.

Figure 6A:
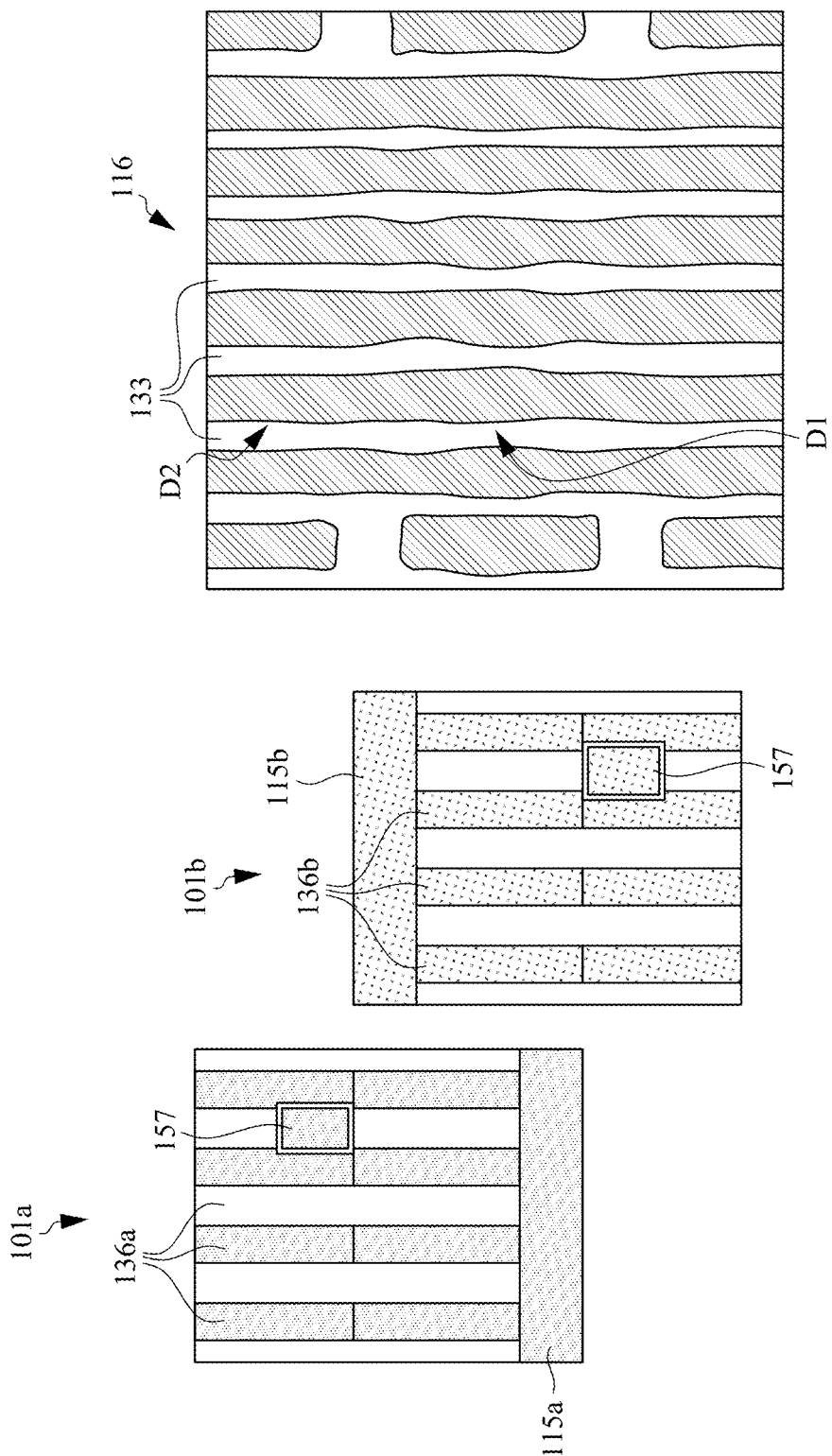
FIGS. 6A and 6B are top views of EUV reticles and patterned wafers, in accordance with some embodiments.

FIG. 6A illustrates a first reticle 101a, a second reticle 101b, and a top view a portion of a wafer 116 manufactured in accordance with the first and second reticles 101a/b, in accordance with some embodiments. In FIG. 6A, an OPC process has not been performed and there has been no widening of the features in the masks 101a/b. The result is that in the features 133 formed in the wafer 116, there is a very narrow portion with a dimension D1, as described in relation to FIG. 2D in the double exposure area. FIG. 6A also illustrates assist features 157 which may be utilized to indicate the position of the stitching zone and single exposure zone.

Figure 6B:
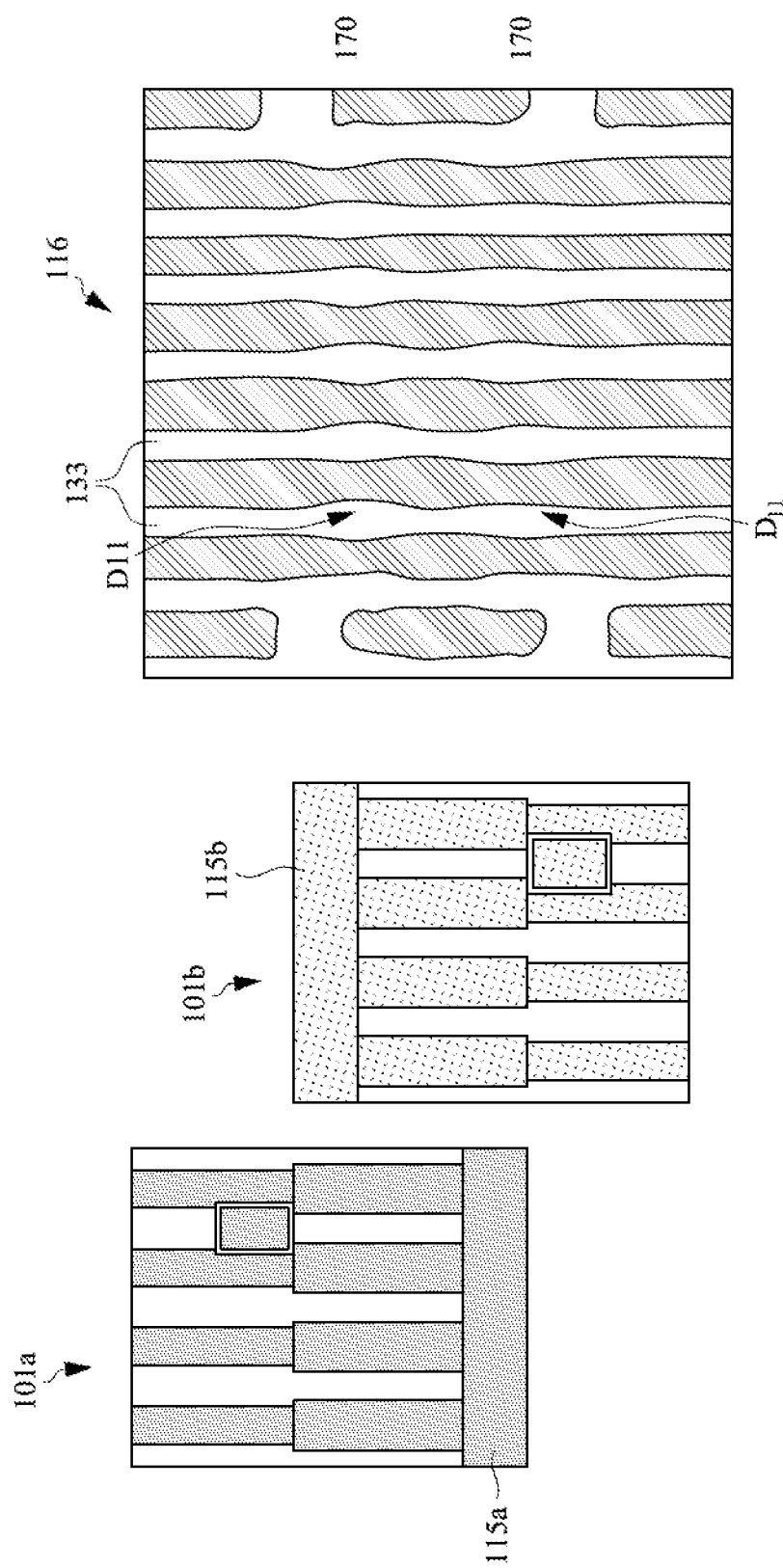

FIG. 6B illustrates a first reticle 101a, a second reticle 101b, and a top view a portion of a wafer 116 manufactured in accordance with the first and second reticles 101a/b, in accordance with some embodiments. In FIG. 6B, an OPC has been performed and there has been a widening of the features in the masks 101a/b. The result is that in the features 133 formed in the wafer 116, there is no narrow portion. Instead, there is a portion of the features having a dimension D11 that is wider than both D1 and D2 into bands above and below the double exposure area. Accordingly, performing OPC and slightly widening features within the double exposure area of the reticles 101a/b can result in features in a wafer that are well-formed and not at risk of being too narrow or breaking. In the stitching region the patterns overlap with the additional absorption area in the other reticle may have slightly different critical dimension (CD) and linewidth roughness (LWR) which forms two bands located above and below the stitching area.

FIGS. 7A-7L are top views and cross-sectional views of a wafer 116 at various stages of processing in accordance with a double exposure EUV photolithography process utilizing first and second reticles 101a/b having additional absorption areas 115a/b as described previously, in accordance with some embodiments. FIG. 7A is a top view of the wafer 116. The wafer 116 is coated with a layer of photoresist 130. In some embodiments, the photoresist 130 is a negative metallic photoresist.

FIG. 7B is a cross-sectional view of the wafer 116 of FIG. 7A. The layer of photoresist 130 is positioned on the substrate 129. While the substrate 129 is shown as a single layer, in practice, the substrate 129 may include multiple layers. The multiple layers can include semiconductor layers, dielectric layers, polysilicon layers, conductive layers, and other types of layers. Furthermore, the substrate 129 can include structures such as transistors, conductive vias, and other types of structures.

In FIG. 7C, the wafer 116 has been exposed to EUV light via the first reticle 101a. The exposure can correspond to a high-NA bright field EUV exposure via the reticle 101a. The first exposure process results in exposed areas 180 of the photoresist 130 and nonexposed areas 182 of the photoresist 130. The nonexposed areas 182 have the pattern of the patterned absorption material of the reticle 101a.

FIG. 7D is a cross-sectional view of the wafer 116 stage of processing of FIG. 7C. The cross-sectional view illustrates that the exposed areas 180 of the photoresist 130 have been transformed, while the nonexposed areas 182 have not been transformed.

In FIG. 7E, the wafer 116 has been exposed to EUV light via the second reticle 101b. The exposure can correspond to a high-NA bright field EUV exposure via the reticle 101b. The second exposure process results in exposed areas 180 of the photoresist 130 and nonexposed areas 182 of the photoresist 130. The nonexposed areas 182 have the pattern of the patterned absorption material of the reticle 101b.

FIG. 7F is a cross-sectional view of the wafer 116 stage of processing of FIG. 7E.

In FIG. 7G, a development process has been performed. During the development process, the nonexposed portions 182 of the photoresist 130 are removed. This results in the substrate 129 being visible in the top view of FIG. 7G. In particular, trenches 184 have been formed in place of the remove portions of the photoresist 130.

FIG. 7H is a cross-sectional view of the wafer 116 at the stage of processing shown in FIG. 7G. FIG. 7H illustrates that the trenches 184 extend to the substrate 129.

In FIG. 7I, an etching process has been performed in the presence of the remaining portions of the photoresist 130. The etching process etches the material of the substrate 129 with respect to the material of the photoresist 130. The result is that the trenches 184 extend deeper into the substrate 129. FIG. 7J is a cross-sectional view of the wafer 116 at the stage of processing of FIG. 7I.

In FIG. 7K, the photoresist 130 has been stripped away. A metal has been deposited on the surface of the substrate 129 and in the trenches 184. After deposition of the metal, a chemical mechanical planarization process has been performed to remove the metal from the surface of the substrate 129 so that metal may only remain in the trenches 184. The result is that metal lines 190 are formed in the substrate 129. The metal lines 190 have the pattern of the absorption material of the reticles 101a/b. The metal lines 190 may have a very small pitch. Other processes can be utilized to form the metal lines 190 without departing from the scope of the present disclosure.

Figure 8:
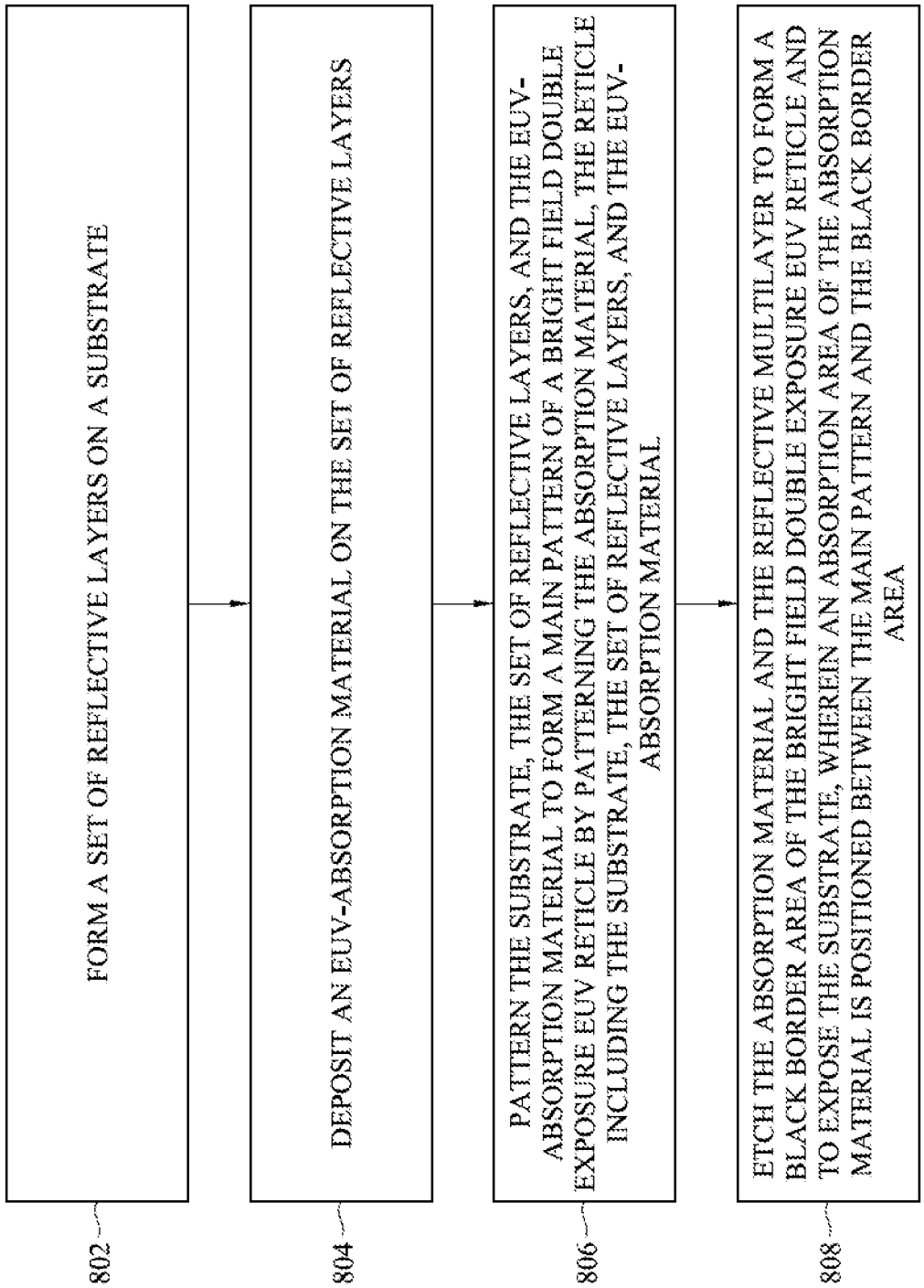
FIG. 8 is a flow diagram of a method for forming an integrated circuit, in accordance with some embodiments.

FIG. 8 is a flow diagram of a method 800, in accordance with some embodiments. The method 800 can utilize processes, components, and systems described in relation to FIGS. 1A-7K. At 802, the method 800 includes forming reflective multilayer on a substrate. One example of a reflective multilayer is the reflective multilayer 140 of FIG. 3K. One example of a substrate is the substrate 138 of FIG. 3K. At 804, the method 800 includes depositing an absorption material on the reflective multilayer. One example of an absorption material is the absorption material 136 of FIG. 3K. At 806, the method 800 includes defining a main pattern of a bright field double exposure EUV reticle by patterning the absorption material, the reticle including the substrate, the reflective multilayer, and the absorption material. One example of a main pattern is the main pattern 113a of FIG. 3K. One example of a reticle is the reticle 101a of FIG. 3K. At 808, the method 800 includes forming a black border area of the bright field double exposure EUV reticle by etching the absorption material and the reflective multilayer to expose the substrate, wherein after forming the black border area, an additional absorption area of the absorption material is positioned at an edge of the black border area between the main pattern and the black border area. One example of a black border area is the black border area 120a of FIG. 3K. One example of an additional absorption area is the additional absorption area 115a of FIG. 3K.

Figure 9:
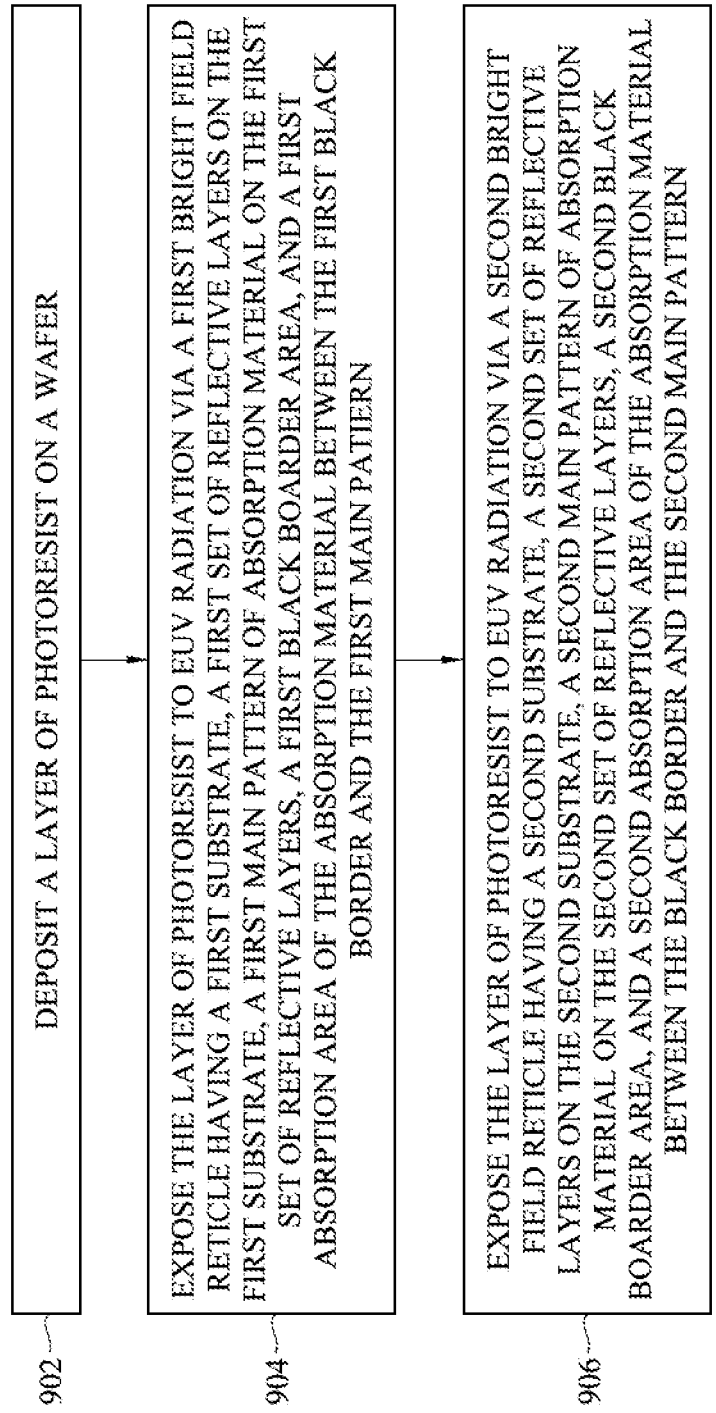
FIG. 9 is a flow diagram of a method for forming an integrated circuit, in accordance with some embodiments.

FIG. 9 is a flow diagram of a method 900, in accordance with some embodiments. The method 900 can utilize processes, components, and systems described in relation to FIGS. 1A-7K. At 902, the method 900 includes depositing a layer of photoresist on a wafer. One example of a layer of photoresist is the layer of photoresist 130 of FIG. 1C. One example of a wafer is the wafer 116 of FIG. 1C. At 904, the method 900 includes exposing the layer of photoresist to EUV radiation via a first bright field reticle having a first substrate, a first reflective multilayer on the first substrate, a first main pattern of absorption material on the first reflective multilayer, a first black border area, and a first additional absorption area of the absorption material between the first black border and the first main pattern. One example of a first bright field reticle is the bright field reticle 101a of FIG. 3K. One example of a first reflective multilayer is the reflective multilayer 140 of FIG. 3K. One example of a first substrate is the first substrate 138 of FIG. 3K. One example of an absorption material is the absorption material 136 of FIG. 3K. One example of a first main pattern is the first main pattern 113a of FIG. 3K. One example of a black border is the black border 120a of FIG. 3K. One example of an additional absorption area is the additional absorption area 115a of FIG. 3K. At 906, the method 900 includes exposing the layer of photoresist to EUV radiation via a second bright field reticle having a second substrate, a second reflective multilayer on the second substrate, a second main pattern of absorption material on the second reflective multilayer, a second black border area, and a second additional absorption area of the absorption material between the black border and the second main pattern. One example of a second bright field reticle is the bright field reticle 101b of FIG. 1B. One example of a second reflective multilayer is the reflective multilayer 140 of FIG. 3K. One example of a second substrate is the substrate 138 of FIG. 3K. One example of an absorption material is the absorption material 136 of FIG. 3K. One example of a second main pattern is the second main pattern 113b of FIG. 1B. One example of a black border is the black border 120b of FIG. 1B. One example of an additional absorption area is the additional absorption area 115b of FIG. 1B.

Embodiments of the disclosure enable the effective use of bright field reticles in high-NA photolithography processes. Embodiments of the present disclosure enable the use of two bright field reticles to produce a single pattern on a wafer via double exposure and stitching. Each bright field reticle includes a reflective multilayer surrounded by a black border. The pattern of the reticle is provided by a patterned absorption layer on the reflective multilayer. Each reticle also includes an additional absorption area on the reflective multilayer at the edge of the black border. The additional absorption area enables the half field exposure and stitching of two bright field reticles to produce, in a layer of photoresist on a wafer, patterns for metal lines that do not include undesired breakages. The result is that bright field reticles can be used to reliably produce metal line patterns with very small pitches. This results in integrated circuits have improved feature density. Wafer yields are also improved.

In one embodiment, a method includes forming a set of reflective layers on a substrate, depositing an absorption material on the set of reflective layers, and patterning the substrate, the set of reflective layers, and the absorption material to form a main pattern of a bright field double exposure EUV reticle by patterning the absorption material, the reticle including the substrate, the set of reflective layers, and the absorption material. The method includes etching the absorption material and the reflective multilayer to form a black border area of the bright field double exposure EUV reticle and to expose the substrate, wherein an absorption area of the absorption material is positioned between the main pattern and the black border area.

In one embodiment, a method includes depositing a layer of photoresist on a wafer and exposing the layer of photoresist to EUV radiation via a first bright field reticle having a first substrate, a first set of reflective layers on the first substrate, a first main pattern of absorption material on the first set of reflective layers, a first black border area, and a first absorption area of the absorption material between the first black border and the first main pattern. The method includes exposing the layer of photoresist to EUV radiation via a second bright field reticle having a second substrate, a second set of reflective layers on the second substrate, a second main pattern of absorption material on the second set of reflective layers, a second black border area, and a second absorption area of the absorption material between the black border and the second main pattern.

In one embodiment, a bright field EUV reticle includes a substrate, a set of reflective layers on the substrate, a buffer layer on the set of reflective layers, and a main pattern of an absorption material on the buffer layer. The reticle includes a black border area exposing the substrate and an absorption area of the absorption material between the main pattern and the black border area and having a sidewall at the black border area substantially coplanar with a sidewall of the buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a set of reflective layers on a substrate;
    depositing an absorption material on the set of reflective layers;
    patterning the substrate, the set of reflective layers, and the absorption material to form a main pattern of a bright field double exposure EUV reticle by patterning the absorption material, the bright field double exposure EUV reticle including the substrate, the set of reflective layers, and the absorption material; and
    etching the absorption material and the set of reflective layers to form a black border area of the bright field double exposure EUV reticle and to expose the substrate, wherein an absorption area of the absorption material is positioned between the main pattern and the black border area.

2. The method of claim 1, comprising forming a buffer layer on the set of reflective layers prior to depositing the absorption material, wherein:
    depositing the absorption material includes depositing the absorption material on the buffer layer; and
    forming the black border area includes etching the buffer layer, wherein after forming the black border area, a sidewall of the buffer layer is substantially coplanar with a sidewall of the absorption area at the black border area, wherein the absorption area of the absorption material is positioned at an edge of the black border area.

3. The method of claim 2, wherein forming the black border area includes undercutting the set of reflective layers below the absorption area.

4. The method of claim 2, wherein patterning the absorption material includes forming a sub resolution assist feature corresponding to a trench between the absorption area and the main pattern.

5. The method of claim 4, wherein the trench has a width less than a resolution limit of an EUV photolithography system that implements the bright field double exposure EUV reticle.

6. The method of claim 2, wherein a top surface of the absorption area is substantially rectangular.

7. The method of claim 2, wherein a first edge of the absorption area is substantially straight along the black border area, wherein a second edge of the absorption area adjacent to the main pattern has a stepped shape.

8. The method of claim 7, wherein the main pattern includes a first strip of absorption material in contact with the second edge of the absorption material.

9. The method of claim 8, wherein the main pattern includes a second strip of absorption material spaced apart from the second edge.

10. The method of claim 8, wherein the main pattern includes a plurality of second strips of the absorption material each adjacent to and separated from a respective step in the second edge of the absorption area.

11. A method, comprising:
    depositing a layer of photoresist on a wafer;
    exposing the layer of photoresist to EUV radiation via a first bright field reticle having a first substrate, a first set of reflective layers on the first substrate, a first main pattern of absorption material on the first set of reflective layers, a first black border area, and a first absorption area of the absorption material between the first black border area and the first main pattern; and
    exposing the layer of photoresist to EUV radiation via a second bright field reticle having a second substrate, a second set of reflective layers on the second substrate, a second main pattern of absorption material on the second set of reflective layers, a second black boarder area, and a second absorption area of the absorption material between the second black border area and the second main pattern.

12. The method of claim 11, comprising forming trenches in the layer of photoresist by developing the layer of photoresist after exposing the photoresist layer to EUV radiation via the first bright field reticle and the second bright field reticle.

13. The method of claim 12, wherein exposing the layer of photoresist to EUV radiation via the first and second bright field reticle results in first portion of the layer of photoresist that is exposed to EUV radiation via the first bright field reticle but not the second bright field reticle, a second portion of the layer of photoresist that is exposed to EUV radiation via the second bright field reticle but not the first bright field reticle, and a third portion between the first portion and the second portion exposed to EUV radiation via both the first bright field reticle and the second bright field reticle.

14. The method of claim 12, comprising forming metal lines on the wafer in a pattern of the first trenches.

15. The method of claim 14, wherein the metal lines have a pitch less than 30 nm.

16. The method of claim 15, wherein the metal lines each have first lateral bulges corresponding to a location of the first absorption area and second lateral bulges corresponding to a location of the second absorption area.

17. A bright field EUV reticle, comprising:
    a substrate;
    a set of reflective layers on the substrate;
    a buffer layer on the set of reflective layers;
    a main pattern of an absorption material on the buffer layer;
    a black border area exposing the substrate; and
    an absorption area of the absorption material between the main pattern and the black border area and having a sidewall at the black border area substantially coplanar with a sidewall of the buffer layer.

18. The bright field EUV reticle of claim 17, wherein the set of reflective layers is undercut below the absorption area.

19. The bright field EUV reticle of claim 17, comprising a sub resolution assist feature corresponding to a trench between the absorption area and the main pattern.

20. The bright field EUV reticle of claim 17, wherein a first edge of the absorption area is substantially straight along the black border area, wherein a second edge of the absorption area adjacent to the main pattern has a stepped shape.

* * * * *